(12) United States Patent
Bednarz et al.

(10) Patent No.: US 6,871,777 B2
(45) Date of Patent: Mar. 29, 2005

(54) ELECTROSTATIC METHODS AND APPARATUS FOR MOUNTING AND DEMOUNTING PARTICLES FROM A SURFACE HAVING AN ARRAY OF TACKY AND NON-TACKY AREAS

(75) Inventors: Thomas Kenneth Bednarz, Richmond, VA (US); Allan Cairncross, Hockessin, DE (US); John Edwin Gantzhorn, Jr., Hockessin, DE (US); George Yeaman Thomson, Jr., Oxford, PA (US)

(73) Assignee: The Regents of the University of California, Oakland, CA (US)

( * ) Notice: Subject to any disclaimer, the term of this patent is extended or adjusted under 35 U.S.C. 154(b) by 69 days.

(21) Appl. No.: 10/322,283

(22) Filed: Dec. 17, 2002

(65) Prior Publication Data

US 2003/0106925 A1 Jun. 12, 2003

Related U.S. Application Data

(62) Division of application No. 09/876,237, filed on Jun. 7, 2001, now Pat. No. 6,540,127.
(60) Provisional application No. 60/213,128, filed on Jun. 22, 2000.

(51) Int. Cl.[7] .................................................. B23K 1/00
(52) U.S. Cl. ....................................................... 228/245
(58) Field of Search .......................... 228/245, 41, 246, 228/49.5, 264, 180.22; 29/900

(56) References Cited

U.S. PATENT DOCUMENTS

| | | | | |
|---|---|---|---|---|
| 3,719,981 A | * | 3/1973 | Steitz | ........................ 438/616 |
| 3,879,248 A | * | 4/1975 | Kest | ........................... 156/289 |
| 3,998,654 A | * | 12/1976 | Falaas et al. | ................... 134/4 |
| 4,354,629 A | * | 10/1982 | Grassauer et al. | ......... 228/56.3 |
| 4,373,429 A | * | 2/1983 | Haas et al. | .................... 99/375 |
| 5,356,751 A | | 10/1994 | Cairncross et al. | |
| 5,506,385 A | | 4/1996 | Murakami et al. | |
| 5,626,277 A | | 5/1997 | Kawada | |
| 6,095,398 A | | 8/2000 | Takahashi et al. | |
| 6,158,649 A | | 12/2000 | Miura | |
| 6,371,599 B1 | | 4/2002 | Hotomi et al. | |
| 6,422,452 B2 | | 7/2002 | Yamamoto et al. | |

* cited by examiner

Primary Examiner—Tom Dunn
Assistant Examiner—Jonathan Johnson
(74) Attorney, Agent, or Firm—Medlen & Carroll LLP

(57) ABSTRACT

Methods and associated apparatus are disclosed for use in mounting particles on and de-mounting particles from a substrate having an array of tacky and non-tacky areas. The particles can be either electrically conducting or electrically non-conducting. Selection of electrically conducting particles is preferred. The substrate having an array of tacky and non-tacky areas can either be electrically non-conducting (e.g., a dielectric substrate) or electrically-conducting. The methods involve use of first and second electrode plates with the substrate therebetween, the plates having applied thereto a direct current potential, which potential in preferred embodiments is reversed in polarity for a number N of cycles. Methods and articles are disclosed using an electrically conductive surface adjacent the tacky and non-tacky areas to minimize static buildup on the particles and tacky and non-tacky areas.

6 Claims, 7 Drawing Sheets

US 6,871,777 B2

ELECTROSTATIC METHODS AND APPARATUS FOR MOUNTING AND DEMOUNTING PARTICLES FROM A SURFACE HAVING AN ARRAY OF TACKY AND NON-TACKY AREAS

This is a divisional of application Ser. No. 09/876,237, filed on Jun. 7, 2001, which claims priority to application Ser. No. 60/213,128, filed on Jun. 22, 2000, now abandoned.

FIELD OF THE INVENTION

This invention relates to an improved method for transporting particles from one surface to another using electrode plates having a direct current potential difference between them. The invention also relates to methods and articles for minimizing static buildup on particles and surfaces.

TECHNICAL BACKGROUND OF THE INVENTION

The placement of particles, such as electrically conductive solder, on contact pads is critical to the adoption of array style semiconductor packages such as ball grid arrays (BGA). Such placement is also critical in the attachment of integrated circuits (IC) to packages or printed circuit boards through flip chip processes. Recent attempts have been made to improve, for example, solder ball interconnects, such that more reliable and/or less costly solder connections are made in electronic applications. Despite these efforts, there are still problems associated with the handling and transfer of particles, primarily conductive particles such as solder balls to form solder bumps, on the contact pads of electronic devices. There is a need for further improvements, particularly with regard to the efficiency, precision, and robustness of the process.

SUMMARY OF THE INVENTION

The present invention is a method for transferring particles from an electrode plate to tacky areas present on a substrate comprising:

a) placing a substrate having both tacky and non-tacky areas between first and second electrode plates, the substrate and electrode plates arranged substantially horizontally and stacked substantially vertically, wherein the first electrode plate
   (i) lies below the substrate,
   (ii) has a surface which faces tacky and non-tacky areas on the substrate, and
   (iii) is spaced from the substrate and the second electrode plate;

b) applying particles over the surface of the first electrode plate; and c) applying a direct current potential between the first and second electrode plates for a time $T_1$, establishing a polarity on the first electrode and thereby causing the particles to be charged and be propelled toward the second electrode plate, resulting in at least a portion of the charged particles becoming adhered to tacky areas on the substrate.

Another embodiment of the invention having additional step(s) includes as step d) changing the direct current potential on the first electrode plate for a time T2 after step c) to cause at least some of the particles to leave non-tacky areas of the substrate, be propelled against the first electrode, again be charged and be propelled toward the second electrode. Still other embodiments include repeating steps c) and d) for a number, N, of cycles as step e), eliminating the direct current potential between the electrode plates and removing particles from the non-tacky areas as steps f) and g), and placing a non-conductive shield between the substrate and the first electrode plate as step h).

In another embodiment, the invention is a method for mounting particles on a substrate having both tacky and non-tacky areas thereon, wherein a direct current potential between first and second electrode plates is used in the method and in which the particles are first applied to a substrate having tacky and non-tacky areas, which substrate is placed over the first electrode.

In further embodiments, the tacky areas are heated to improve adhesion and centering of the particles in the tacky areas. The invention also comprises apparatuses for practicing the above methods. The invention also comprises an article having a substrate or surface with tacky and non-tacky areas that has an electrically conductive surface adjacent to the tacky and non-tacky areas to dissipate electrostatic charges and a method for changing the tacky and non-tacky areas.

DETAILED DESCRIPTION OF THE INVENTION

Figure 1:
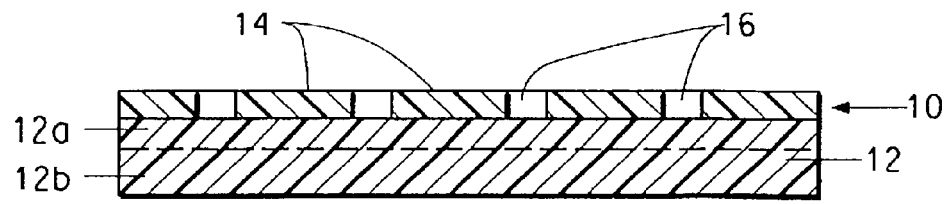
FIG. 1 is a simplified section view of one embodiment of a surface having an array of tacky and non-tacky areas thereon, which surface is suitable for use with the inventive methods, wherein the tacky and non-tacky areas are disposed coplanar with one another.

This invention relates to an improved method and apparatus based upon electrostatics for precisely and efficiently adhering particles to tacky areas on a surface of a substrate having an array of tacky and non-tacky areas and removing particles from the non-tacky areas without removing particles from the tacky areas. This net adhering of particles to the tacky areas on the surface is termed net population of the substrate. For most applications of this invention, it is desired that there be one and only one particle attached to each tacky area of the substrate.

In one embodiment of this invention, the substrate and particles are placed between two electrodes and an electric field is applied to propel the particles onto the substrate to populate the tacky areas. In another embodiment, the electric field is applied to remove particles from the non-tacky areas of the substrate after populating the tacky areas. The method and apparatus are useful with both electrically conductive and non-conductive particles and substrates.

Cairncross et al., U.S. Pat. No. 5,356,751, which is incorporated by reference discloses a process and product for mounting free-flowing particles, which employs a support having a support surface with an array of tacky areas which have a size and bonding strength suitable for adhesion of either one or two of said particles. In the process, the particles flow across the support surface to allow particles to contact the tacky areas and adhere thereto.

Substrates Having Arrays of Tacky and Non-Tacky Areas and Associated Methods

The array and method described herein are particularly suited for use with free-flowing particles. By free-flowing is meant that there is no substantial binding force to be overcome when separating a mass of particles into separate discrete particles and that the particles do not stick to one another or clump together under normal conditions of use. A discussion of particle to particle binding forces is presented in U.S. Pat. No. 5,356,751.

For most electronic applications, the preferred particles for use in connection with this invention are electrically conductive materials, such as Cu, In, Pb, Sn, Au, and alloys thereof. Most preferred are solder balls. It will be apparent to those skilled in the art, however, that the type of particle used in connection with the present invention is dictated by the particular application and is not an inherent limitation of the invention. For example, a particular application may require that an electrically insulating material be applied to a solder bump on a contact pad; e.g., to space one contact pad from another in a stack of circuit boards. The present invention may be used to advantage in such circumstances. Generally speaking, spherical particles will be preferred in the practice of this invention because of their ease in handling and particle symmetry, however, the size and shape of the particles are not critical to the invention. For example, slightly off-round particles, such as seeds, work well with this invention.

For other applications outside the electronic field, the particles can have properties without any particular size or shape limitations except for the limitation that the particles must have sufficient compatibility with the tacky areas such that the adhesive force bonding each particle to a given tacky area is at least the minimal value specified herein (i.e., at least 2 grams/mm2). The particles, such as beads, can either be electrically-conductive or electrically-non-conductive such as glass; organic, inorganic, organometallic, or mixtures thereof; polymeric or non-polymeric; and living or non-living. Examples of suitable particles for this invention include, but are not limited to, mineral grains, chemical products, salt and sugar granules, polymer particles, mechanically ground solids, pollen, spores, and seeds. Some specific chemical product particles are solder, alumina, and silica; a specific mineral grain is glass. Some specific polymer particles are poly(styrene), poly(methylmethacrylate) and poly(ethylene). Organic, inorganic, or organometallic chemical compounds that are pharmaceuticals, herbicides, pesticides, or have other biological activity are suitable particles for this invention; these compounds can be present at levels lower than or equal to 100% of the particle composition. If lower, other components can be present in the particles without limit. The particles can comprise any gas(es) and/or liquid(s) compounded with (e.g. absorbed on) any solid(s). For example, particles comprising dimethylsulfoxide (a liquid) absorbed onto alumina (a solid) are suitable in this invention.

As used herein, the term tacky areas means areas, volumes, or regions having adhesive properties to enable a bond to form immediately upon contact with free-flowing particles under low pressure (e.g., the weight of the particles or the wetting action between the adhesive and the particles). The areas have a thickness that plays a role in centering the particles and maximizing the surface area for adhesive contact. In accordance with this invention, the tacky areas have a size and bonding strength suitable for adhesion of one particle per tacky area. Typically, the tacky areas are small shapes (i.e., dots) from about 0.25 um to 1000 um and for many embodiments they are from about 10 um to 500 um. The tacky area shapes may be circular, square, rectangular, oval, or another shape suitable for retention of the particle. Generally, circular shaped tacky areas are preferred.

The spacing of the tacky areas is such that the position of one particle on one tacky area relative to the position of other particles on adjacent tacky areas matches the distance between and relative position of the contact pads of the electronic (or other) device to which the particles will be transferred and become attached. The actual dimensions used for the tacky area spacing and the contact pad spacing must take into account differences in thermal expansion that may occur between the material of the substrate and the material of the electronic device. At the temperature used during transferring, the spacings should match. The location of the tacky areas at least must allow the particles to touch some part of the contact pad to which it will become attached. In the embodiment where the particle melts (e.g., solder particles in contact with solder flux and a metallized contact pad), direct contact is required between the molten particle and the pad so that the molten particle can wet the pad and flow across the metal surface to cover the metallized pad. The initial contact of the particle with the metallized contact pad may be off-center because the wetting action of the molten particle will center the particle over the pad during attachment. For these noncritical embodiments, the original pattern of tacky areas is such that the location of each tacky area must align and overlap somewhere within the area of the corresponding contact pad area to which it will attach, and the size of the tacky area must be smaller than the particle so that only one particle is attached to each tacky area. Typically, for a tacky area having a particular size and bonding strength, there is an upper limit to the size and weight of particle, above which there is no substantial particle adherence, and there is a lower limit to the particle size which will adhere singly to each tacky area. For tacky areas with a tackiness of 2 to 6 grams/mm2 and particles of 0.127 to 0.762 mm (0.005 to 0.030 inch) diameters, the tacky area may be as small as 15% of the particle diameter to as large as 100% of the particle diameter and still get single particle attachment per tacky area. A tacky area of 30 to 60% of the particle diameter is preferred.

In cases where the contact pads are close together relative to the size of the particle, care must be taken so that the particles on adjacent tacky areas do not touch before and during attachment to the contact pads so as to avoid bridging adjacent contact pads. As the space between contact pads become smaller relative to the width of the pad and hence, to the width of the particle to be attached to the contact pad, it becomes critical to align the tacky areas and particles closer to the center of the matching contact pads to which the particle will become attached. This is accomplished by centering the tacky area positions in the imaging step to match the center of the contact pads and using a combination of smaller tacky areas and an optimum combination of tacky area thickness and diameter for the particular surface curvature of the particle to achieve self-centering of the particle in the tacky area (see later discussion of self-centering).

Single particle attachment to each tacky area is assured when the size of the particle is large enough to cover the tacky area upon attachment, thus preventing further particles from ever touching the tacky area of an occupied tacky area. For the preferred embodiments of spherical particles and circular tacky dot areas, this is achieved once the diameter of the tacky dot area is less than the diameter of the smallest particle. A narrow size range for the particles is also desired to control the volume after the particle is attached to the contact pad. A uniform particle diameter is also desired for good contact between particles attached to tacky areas on a transfer substrate and the contact pads of the electronic device to which the particle is to be transferred. A size range of +/−10% for the particle diameter is preferred.

The array of tacky and non-tacky areas preferably has clearly defined tacky areas and has no foreign material adhered thereto. Preferably, the non-tacky areas are flat and smooth and are either disposed coplanar with the tacky areas or the tacky areas are disposed below the plane of the non-tacky areas. Most preferably, the non-tacky areas are flat and smooth and are disposed co-planar with the tacky areas. Although less preferred, the tacky areas may be disposed above the plane of the non-tacky areas. In each of these cases, there can be material at the interface of a given tacky area with the non-tacky area that is slightly out of plane right at the interface (either above or below the plane of the interface even starting with a coplanar substrate prior to imaging to form the array of tacky and non-tacky areas). While not being bound by any theory, it is believed in the case of a photopolymer layer that this effect results from the diffusion of unpolymerized components from the tacky areas into the non-tacky areas thickening the border around the tacky areas. Also lightly crosslinked tacky areas are less dense and slightly thicker than more highly crosslinked non-tacky areas.

In a particularly preferred embodiment, the array of tacky and non-tacky areas comprises a photosensitive element that has been imagewise exposed to create the array. A variety of positive and negative photosensitive compositions are known to produce tacky images and may be used in the practice of this invention. Phototackifiable compositions become tacky where struck by light and are exemplified by compositions described in U.S. Pat. No. 5,093,221, U.S. Pat. No. 5,071,731, U.S. Pat. No. 4,294,909, U.S. Pat. No. 4,356,252 and German Patent No. 3,514,768. Photohardenable compositions are those which become hardened in light struck areas. A number of photohardenable compositions include Cromalin® Positive Proofing Film SN 556548, Cromalin® 4BX, Surphex™ (embossable photopolymer film, Cromatone® Negative Overlay Film SN 031372, and Cromalin® Negative Film C/N all available from E. I. du Pont de Nemours and Company, Wilmington, Del. Cromalin® Positive Film SN 556548, Cromalin® 4BX and Surphex™ are preferred. These and other photosensitive products are disclosed in U.S. Pat. No. 3,649,268, U.S. Pat. No. 4,174,216, U.S. Pat. No. 4,282,308, U.S. Pat. No. 4,948,704 and U.S. Pat. No. 5,001,037.

Photohardenable compositions are generally a combination of polymeric binder and photopolymerizable monomers. Suitable binders include co(methyl methacrylate/methacrylic acid) and monoethyl ester of poly(methyl vinyl ether/maleic anhydride), each of which may be copolymerized in various proportions. Suitable photopolymerizable monomers include ethylenically unsaturated monomers which have been found useful are those disclosed in U.S. Pat. No. 2,760,863; U.S. Pat. No. 3,380,831 and U.S. Pat. No. 3,573,918. Examples are dipentaerythritol acrylate (50% tetra and 50% penta), pentaerythritol triacrylate and tetraacrylate, polypropylene glycol (50) ether of pentaerythritol tetraacrylate, polyethylene glycol (200) dimethacrylate, dipentaerythritol triacrylate b-hydroxyethyl ether, polypropylene glycol (550) ether of pentaerythritol tetramethacrylate, pentaerythritol tetramethacrylate, polypropylene glycol (425) dimethacrylate, trimethylolpropane trimethacrylate, and polypropylene glycol (340) ether of trimethylol propane triacrylate. (Note: Numbers within parentheses in this paragraph, e.g., 550, 425, 340, and 50, are number average molecular weights.) Also useful are epoxy monomers containing ethylene unsaturation, e.g., monomers of the type disclosed in U.S. Pat. No. 3,661,576 and British Patent No. 1,006,587. The binder may be varied widely in its ratio with the monomer but in general it should be in the range of 3:1 to 1:3. The monomer should be compatible with, and may be a solvent for, and/or have a plasticizing action on the binder. The choice and proportions of monomer and binder are made in accordance with the requirements of selective photo adherence.

When the pattern of tacky areas is not used immediately, or is stored or shipped, it is useful to keep the tacky areas clean by protecting them with a cover sheet such as a polyester film, polypropylene film, or silicone release polyester film. Generally a thin 0.0127 mm (0.0005 inch) Mylar® polyester film (E. I. du Pont de Nemours and Company, Wilmington, Del.) is sufficient.

When using photosensitive compositions to create the array of tacky and non-tacky areas, the photosensitive composition is first applied to a suitable substrate and is then imagewise exposed to create the desired array of tacky and non-tacky areas. As discussed more fully below, the choice of substrate will largely depend upon the method selected to mount the array of particles to the contact pads. Generally speaking, however, the substrate should be stable under the conditions of intended use, smooth, and show good adherence to the photosensitive composition. As will be recognized by those skilled in the art, one or more intermediate layers may be applied to the substrate to improve adhesion of the photosensitive layer. In one embodiment of this invention, the photosensitive composition is applied to a metallic layer (or to a layer of another material that is electrically-conductive) to afford a preferred article of this invention—see detailed discussion infra.

There should be facile control of the tacky areas with respect to size and placement. For the aforementioned photosensitive products, the array pattern is first composed by manual or computer assisted design, and is usually transferred to a photographic film that is used as a photo tool in contact with the photosensitive product and with strong ultraviolet light to pattern the tacky array in the photosensitive product. For the Cromalin® products, the photosensitive material would first be laminated to or coated onto the substrate and then exposed through the phototool to create the pattern. The pattern could be made to coincide with the interconnect positions of a circuit board. For Cromatone®, a clear plastic film substrate is provided with the product so that it may be exposed directly through the phototool. Other patterning methods include projection exposure and direct writing as in digital imaging using a laser output device.

With reference now being made to FIG. 1, an article or web 8 having an array of tacky and non-tacky areas suitable for use in accordance with the process of the invention is illustrated therein. In the embodiment shown, the article comprises a photosensitive layer 10 applied to a substrate 12. The photosensitive layer 10 has been imagewise exposed to produce alternating areas 14 which are non-tacky and areas 16 which are tacky. If the photosensitive layer 10 is a phototackifiable composition, the areas 16 would correspond to the exposed areas whereas if the photosensitive layer 10 is a photohardenable composition, areas 16 would correspond to the unexposed areas.

The substrate as shown in FIG. 1 may itself be electrically non-conductive or electrically conductive, or a conductive layer can be present as a separate layer 12a on a substrate base 12b, in which case normally the conductive layer 12a would be between the photosensitive layer 10 and the substrate base 12b. The conductive material may be useful in controlling electrostatic charge on the web. The conducting layer is comprised of an electrically-conducting material. Suitable materials that are electrically-conducting include, but are not limited to, metal(s), metal oxide(s), and electrically-conducting polymers. Suitable metals or metal oxides include, but are not limited to, aluminum, copper, and indium tin oxide. Electrically-conducting polymers may also be used which may include polymers containing very fine electrically conductive particles, such as carbon particles.

The conducting layer can either be present as a separate layer 12a that is adjacent to and in contact with a substrate 12b, or, alternatively, the conducting layer can be present without a separate substrate, in which case it serves as its own substrate 12. In the case of the former, the conducting layer 12a can be applied to the substrate 12b by any methods known to the art, which include, but are not limited to, coating, vacuum deposition, and electroless plating. In the case of the latter, illustratively, one example where the surface and the conducting layer are present in one layer is a layer of copper or aluminum (e.g., copper foil or aluminum foil) of sufficient thickness such that the layer simultaneously serves as the substrate 12 as well as being the conducting layer. In a further alternative, the conductive layer can be present on the substrate as part of the tacky and non-tacky area, that is, the tacky and non-tacky areas themselves may be electrically conductive.

Figure 2:
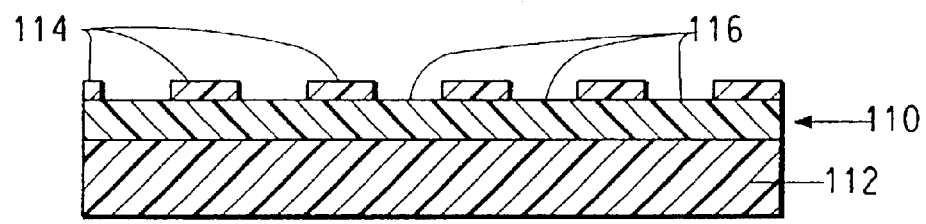
FIG. 2 is a simplified section view of another embodiment of a surface having an array of tacky and non-tacky areas thereon, which surface is suitable for use with the inventive methods, wherein the tacky areas are disposed below the plane of the non-tacky areas.

An alternative to the tacky and non-tacky areas being a phototackifiable composition, is for the article to be formed by attaching a thin sheet material having an array of holes to an adhesive coated substrate. Examples of such sheet material include screen mesh or stencils wherein holes have been formed by, for example, laser ablation, punching, drilling, etching, or electroforming. The article may also be formed by providing photoresist hole patterns on an adhesive coated substrate. An example of such an alternate article or web 108 is illustrated in FIG. 2, wherein an adhesive layer 110 is applied to a substrate 112. The substrate can itself be non-conductive or conductive, or a conductive layer can be present as a separate layer on a non-conductive substrate, in which case normally the conductive layer would be between the photosensitive layer and the substrate. The tacky and non-tacky areas themselves may be conductive. A thin sheet material 114 having holes 116 therein is then applied over the adhesive layer 110. The adhesive layer 110 is an outer surface in the areas of the holes 116 in the sheet material 114, thereby affording the tacky areas. It will be apparent to those skilled in the art that a similar type of structure, that is, a non-tacky surface having recessed tacky areas, will also result from the use of certain photosensitive materials (e.g., negative Cromalin® or Cromotone®) which produce a peel-apart image. Generally, the further the tacky area is recessed in relation to the non-tacky area, the more likely size exclusion will occur, where no particles larger than the width at the tacky area recess, will attach. This effect becomes particularly pronounced as the tacky area recess approaches the size of the tacky area, that is, the depth of the tacky area is approximately equal to its width.

Figure 3:
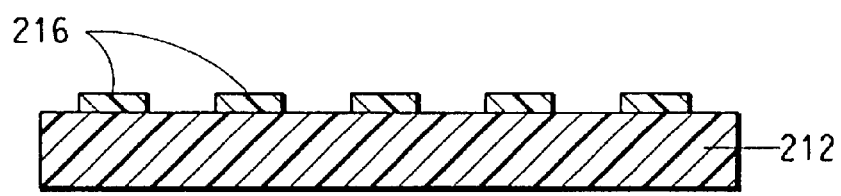
FIG. 3 is a simplified section view of still another embodiment of a surface having an array of tacky and non-tacky areas thereon, which surface is suitable for use with the inventive methods, wherein the tacky areas are disposed above the plane of the non-tacky areas.

With reference now being made to FIG. 3, still another embodiment of an article or web 208 having an array of tacky and non-tacky areas suitable for use in accordance with the process of the invention is illustrated therein. In the embodiment shown, the article 208 comprises an array of tacky areas 216 on a non-tacky substrate 212.

It is noted that in the embodiment shown in FIG. 1, the tacky areas 16 are disposed co-planar with the non-tacky areas 14 whereas in the embodiment of FIG. 2, the tacky areas, corresponding to holes 116, are disposed below the plane of the sheet material 114, which defines the non-tacky areas. It is further noted that in the embodiment shown in FIG. 3, the tacky areas 216 are disposed above the plane of the non-tacky conductive layer 212.

This invention relates to improved articles and methods for efficiently and precisely adhering particles to the tacky areas (as described above) on a surface containing an array of tacky and non-tacky areas and removing particles from the non-tacky areas without removing the particles from the tacky areas. The improved articles and methods are discussed in depth in the section following this one.

Following the population process, in many applications for this invention, the array of mounted particles described above is transferred to contact pads of an electronic device. The contact pads are usually made of a conductive metal such as copper, aluminum, gold, or a lead/tin solder. In a preferred method of transfer of the mounted particles, an array having a single conductive (e.g., solder) particle adhered to the tacky areas thereof is placed in contact with the contact pads of an electronic device such that the particles are placed in registered contact with each of the contact pads and the particles are then released from the tacky areas of the array and are adhered to the contact pads. The array of tacky and non-tacky areas may themselves be electrically conductive or they may be on a substrate surface and have a conductive surface adjacent to these areas. This method will be referred to as the transfer method. In an alternate method of transfer, the array of tacky and non-tacky areas is formed directly on the contact pads (such as by coating, laminating etc.) prior to the particles being adhered thereto. Once again, the array of tacky and non-tacky areas may themselves be electrically conductive or they may be on a surface layer and have a conductive surface adjacent the tacky and non-tacky areas; the contact pads where the tacky areas are located are already, by definition, electrically conductive and may serve as the conductive layer adjacent the tacky areas. This method will be referred to as the direct method.

In either the transfer method or the direct method, it is necessary to disassociate the particles from the tacky areas of the array. There are many alternate methods to accomplish this step, some of which are more applicable to either the direct method or the transfer method than to the other. For example, disassociation of the particles can be accomplished by mechanical forces, that is, an adhesive compound (e.g., a viscous flux, acting as an adhesive or having an adhesive component) can be applied to the contact pad. Upon contact of the solder ball to the adhesive compound, a bond forms which is stronger than the bond between the solder ball and the tacky area of the array. Thus, upon removal of the array from the contact pads, the particles are released from the tacky areas and remain adhered to the contact pads. Mechanical disassociation of the particles is particularly applicable to the transfer method.

Thermal disassociation is yet another method of disassociating the particles from the array. By thermal disassociation is meant the application of heat sufficient to cause the particles to melt, wet the surface of the contact pads and flow to cover the pads. Preferably, as the particles melt, the substrate is brought closer to the contact pads to make sure that all particles contact their respective contact pads. Spacers may be used to keep the surface uniformly off contact from the contact pads themselves so as not to squeeze solder beyond the contact pads.

The heat necessary to melt the particles may be provided by use of an oven, laser, microwave, infrared radiation or other convenient source. Temperatures in the range of 150° C. to 400° C. are normally sufficient to cause the reflow of the particles, particularly solder balls. It will be apparent to the skilled artisan that, in the event the substrate will be heated together with the particles, the substrate should be capable of withstanding such temperatures; that is, it should be thermally stable. Non-conductive substrates, such as Kapton® (a polyimide film available from E. I. du Pont de Nemours and Company, Wilmington, Del.), quartz, glass and the like, may be used to advantage. Likewise, with regard to the material used to form the tacky and non-tacky array, such material should not melt during the heat step, but rather should be thermally stable or, alternatively, should completely volatilize at such temperatures. Negative Cromalin® in particular has a tendency to melt during an oven heating disassociation step and thus is largely unsuitable for use with oven heating. In the event that the heat source used will not heat the substrate or tacky and non-tacky areas (e.g., a laser), thermal stability is not of great concern.

Another method that may be used to disassociate the particles is photodisassociation. In this method, the tacky areas are exposed to actinic radiation whereby they lose their adhesive properties to disassociate the particle.

To improve the wetting and adhesion of the particle, particularly solder balls, to the contact pads, a suitable flux may be used. A solder flux combination (e.g., rosin types, no-clean types, organic acid or synthetic activated) can be coated on the pads areas and/or on the solder balls to help clean oxide layers from the pad and solder, improving wetting of the metallized pad by molten solder thereby effecting disassociation of the solder ball from the tacky area and adhesion thereof to the contact pad.

In the direct method, it is critical that the molten particle disassociate or displace the tacky area on the contact pad and completely wet the contact pad with the molten particle (e.g., solder). This could be accomplished by decomposing the tacky areas to volatile compounds when the melting temperature of the particles is reached or by using thermally stable tacky area materials that would be displaced by the molten particle.

Once the particles have been released from the tacky areas and melted, they are allowed to cool and resolidify on the contact pads, e.g., to form a solder bump.

Population

This invention encompasses electrostatic methods for mounting and demounting particles from a surface having an array of tacky and non-tacky areas. In populating the array of tacky and non-tacky areas, it is desired to effect placement of a controlled number of particles on each tacky area while ensuring that there are no excess particles remaining in any area that is non-tacky, at the end of the population process. Most often for electronic applications in particular, it is desirable to place precisely one particle on each tacky area.

In general, the population step may be accomplished in a number of ways. Generally the article with the pattern of tacky areas is placed in a container with an excess of particles and the container gently moved so as to allow the particles to move across the array until all tacky areas become occupied. Alternatively, excess particles are sprinkled onto the tacky areas until all tacky areas are covered with particles. Excess particles are removed from the fully occupied pattern of tacky areas by gravity, gentle tapping, gentle blowing, vacuum and other methods. The force used in the clean up of excess particles depends on the adhesive strength of the bond between the tacky areas and the particles. This step, the application of free flowing particles to patterns of tacky areas, is accomplished best when electrostatic charging is avoided by using electrically conducting, grounded containers, humidified atmosphere and with the use of ion generators, as in the use of ionized air. This step is further aided by a clean atmosphere to prevent the attachment of foreign matter to the tacky areas.

Figure 4:
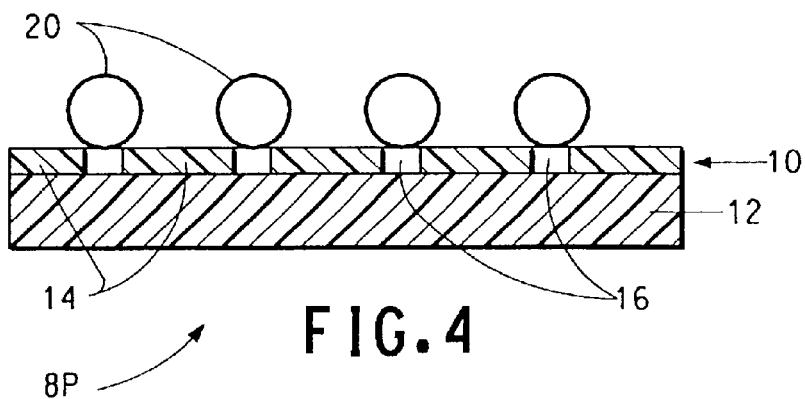
FIG. 4 is a simplified section view of the array of FIG. 1, shown in combination with a particle adhered to each tacky area.
Figure 5:
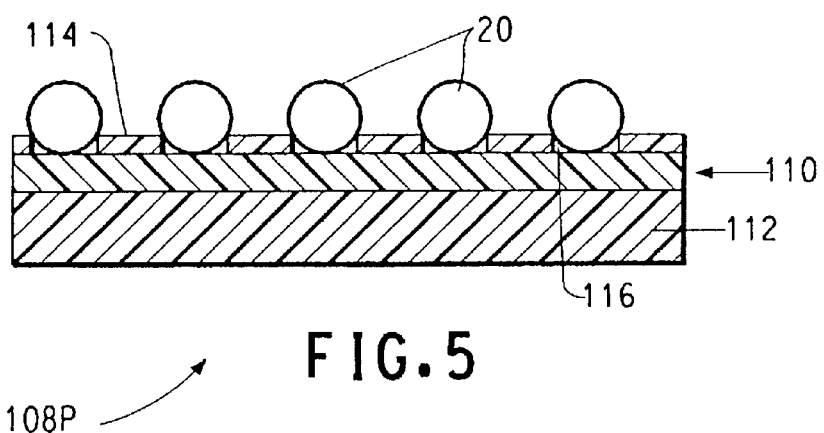
FIG. 5 is a simplified section view of the array of FIG. 2, shown in combination with a particle adhered to each tacky area.
Figure 6:
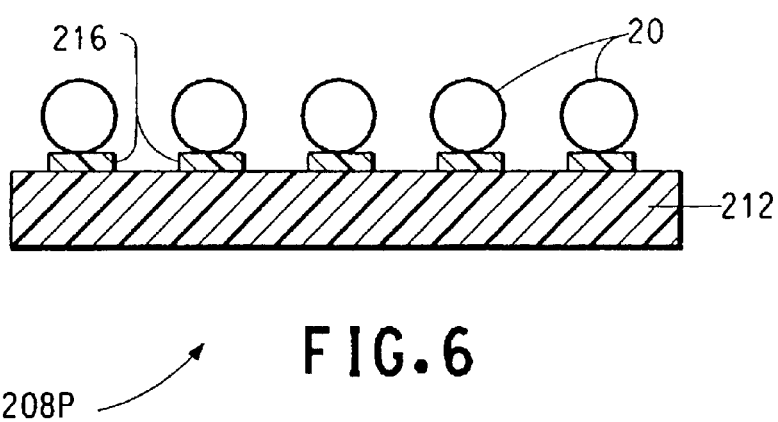
FIG. 6 is a simplified section view of the array of FIG. 3, shown in combination with a particle adhered to each tacky area.

FIGS. 4, 5, and 6 illustrate the different cases of the arrays shown in FIGS. 1, 2, and 3 respectively, with spherical particles 20 attached to the tacky areas 16, 116, and 216 of the array to form populated articles or webs 8p, 108p, and 208p, respectively.

The figures above showing particles attached to tacky areas of an array of tacky and non-tacky areas are schematic. It should be understood that these figures depict representation(s) not-to-scale. In actual practice of this invention, typically particles initially attach to tacky areas near the perimeter of the tacky area with relatively light wetting of the particle by the tacky area. Later, at equilibrium wetting, typically there is full or nearly full embedding of particles in the tacky areas with centering of the particles.

The process of attaching particles to patterns of tacky areas is aided by the tacky areas having sufficient tackiness to grab and hold the particles immediately upon contact. It is further desired for the attachment of the particle to the tacky area to be strong enough to withstand the various forces (e.g., vibrating, tapping, shaking, jiggling, moving, bumping contact, vacuum or blowing forces, electrostatic propulsion, etc.) that occur while populating the array with particles and during the removal of excess particles from the fully populated array. In a preferred method vibrating is employed at not greater than 1000 cycles per minute to distribute particles over the tacky and non-tacky areas and dislodge particles from the non-tacky areas. In addition, it is advantageous to have sufficient adhesive strength between the particles and the tacky areas to hold the particles in place during handling and possible shipment. Furthermore, tacky areas with a tackiness of at least 0.5 grams/mm2 can be populated by particles, but it is preferred that the tacky areas have a tackiness of at least 2 g/mm2 and it is most preferred that the tacky areas have a tackiness of at least 5 g/mm2, especially when patterns of tacky areas populated with particles are to be shipped without loss of the particles.

The goal is perfect population with one particle per tacky area and no extras; with total errors (TE) per populated article of zero. Expressed as an equation:

$$TE = V + TW + EX$$

where TE=total errors per article

V=total number of vacant tacky areas per article

TW=total number of extra particles associated with a tacky area or "twins" per article EX=total number of extra particles left on non-tacky areas per article Then the error rate ER for the populated surface becomes $$ER = 1,000,000(TE)/TA$$

where ER=error rate in parts per million (ppm) tacky areas

TA=total number of tacky areas per article
TE total errors per article

For almost all tacky areas small particles will attach to the edge of the tacky areas as soon as the particles flow across the tacky areas provided that the kinetic energy of the particle is less than the initial bonding strength of the particle to the tacky area. Once the tacky areas are buried with excess particles at rest the number of vacancies V is very low. Remaining vacancies can be filled by gentle agitation of the particles across the article with periods of rest and V becomes essentially zero. However, the number of excess particles TW+EX is near infinity. If sufficient cleaning force is applied, all the excess particles can be removed and TW+EX becomes zero. To be successful the cleaning force must be enough to remove all the excess particles from the non-tacky areas yet the cleaning force must be less than the adhesive force between the particles and the tacky areas. We find that in many cases of freshly populated tacky areas that immediate attempts to remove the excess particles results in removing many particles from the tacky areas. The initial adhesion (Adh0) of the particle to the tacky areas can be very low, such that the forces applied to clean off excess particles TW+EX exceeds the adhesive force of the particle to the tacky area, and V becomes large. This is particularly true with rough particles that are not wet well by the tacky areas (adhesion increases as the wetting area of the particle by the tacky area increases).

Holding the array of tacky and non-tacky areas with particles adhered thereon for a period of time and at a temperature of greater than or equal to 30° C. allows the particles to adhere and center better to the tacky areas. During this time period the surface area of the particle wet by the tacky area increases, the particle is drawn deeper into the tacky area and the particle moves toward the center of the tacky area. This process stops when the particle penetrates through the tacky area and comes to rest in contact with the bottom of the tacky area or the circumferential rim of the tacky area. This process is quite slow at or near ambient temperature (e.g., 20° C.) and may take an hour or more to reach equilibrium. The time to reach equilibrium depends on several factors including the thickness of the tacky area, the width of the tacky area, the viscosity of the tacky material, the surface energies of the tacky material and particles which determines wetting rates and characteristics. Heating the array of tacky and non-tacky areas covered with particles adhered thereon greatly speeds up the wetting process and adhesion build-up of the particles to the tacky areas during the hold period. There is an advantage in quickly providing robust adhesion of particles to the tacky areas for it allows for cleaning off the excess particles shortly after they were applied without the loss of particles attached to the tacky areas making the overall process much more convenient and efficient. In some cases it may be advantageous to heat the particles also, or to just heat the particles and not the tacky areas when the particles have sufficient thermal inertia to retain their heat for a brief period of time until they engage a tacky area.

Suitable hold times for the methods of this invention vary with temperature in the heating step. Illustratively, the period of time for the hold time can broadly range from 5 seconds to 45 minutes. When the temperature in step (d) is at least 30° C., the period of time in step (d) ranges from 10 seconds to 10 minutes. When the temperature in step (d) is at least 35° C., the period of time in step (d) ranges from 10 seconds to 4 minutes. When the temperature in step (d) is at least 40° C., the period of time in step (d) ranges from 5 seconds to 60 seconds. In special embodiments where the temperature is less than 30° C., the hold time can range from 2 minutes to 1 hour.

Another surprising benefit of certain process improvements is centering of the particles in the tacky areas during the hold period with or without heating. With the correct match of tacky area thickness, width and particle geometry the wetting process that occurs during the hold period draws the particle to the exact center of the tacky area. It is believed that surface tension forces between the viscous tacky liquid and the particle surface play a dominant role in this centering process. The wetting process and centering action has been observed to occur equally well whether gravity is aiding or opposing the joining of the particle and tacky area. That is, the process has been demonstrated with the particle and tacky area on the topside or bottom-side of the substrate. This self-centering effect can be critical for aligning particles with receptor pads in a transfer process, especially when the spacing between particles and between pads is small relative to the particle size.

Figure 8:
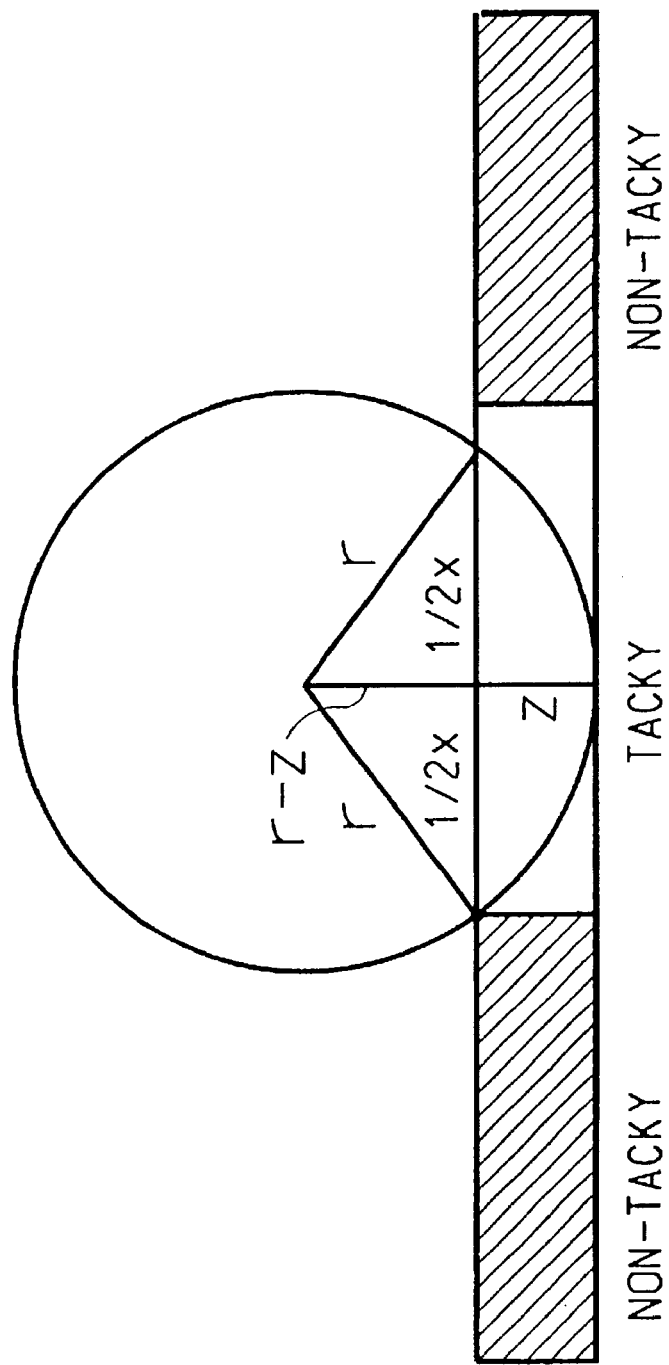
FIG. 8 illustrates the geometrical relationships involved for self-centering of a sphere of diameter 2 r in a tacky area of thickness z with contact diameter x and with the sphere penetrating all of the tacky area and resting on the substrate at the bottom of the tacky area.

Complete centering depends on the tacky area diameters being less than or equal to a calculated wetting or contact diameter (x) of a sphere for a particular sphere diameter (2r) and tacky area thickness(z). It is only under these conditions that the sphere rests on the complete perimeter of the tacky area and, by definition, is completely centered. The relationships of r, x and z are illustrated in FIG. 8 and described in the equation:

$$r^2 = (0.5x)^2 + (r-z)^2$$

where:

sphere radius=r
wetting diameter=x
adhesive thickness=z
approximate contact area=3.1416(½x)²

If the tacky area diameter is too much smaller than the calculated wetting diameter, the wetted area becomes too small to achieve good adhesive forces. For conditions where exact centering is not required, the tacky area diameter may be larger than the calculated wetting diameter and still be substantially centered as shown in FIG. 8. Accordingly, the tacky area diameter may be 70%–170% of the calculated wetting diameter and still work well for purposes of this invention.

A pattern of tacky dots on 50 micron thick Kapton® film was populated with 125 micron solder spheres and immediately turned upside down and used to cover a hole in a sheet aluminum spacer on a microscope's hot stage. Using a combination of reflected and transmitted light the tacky dots and attached solder spheres were viewed immediately through the Kapton® E. The perimeter of the tacky dots and the contact area of the solder spheres were in sharp focus while the solder sphere appears as a dark shadow.

Figure 7A:
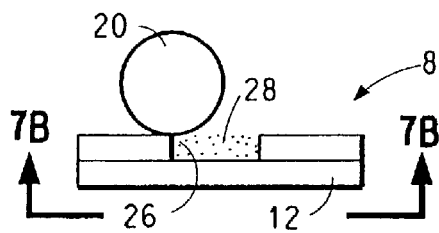
FIG. 7A is section view of a spherical particle initially adhering to a tacky area on a substrate.

FIG. 7A illustrates the web 8 of FIG. 1 in the condition where a spherical particle 20 first engages the corner 26 of a tacky dot 28 on a substrate 12. In FIG. 7B, which is a view looking in the direction of arrows 7B—7B of FIG. 7A, the cross-hatched circle 30 represents the contact area on the surface of the particle 20 that is wetted by the viscous tacky polymer of the tacky dot 28. The solid line circle 32 represents the perimeter of the viscous tacky dot 28. The dashed line circle 34 represents the particle diameter which appears as the dark shadow when actually viewing the particle through the translucent web from the bottom-side.

The following observations were made. The contact area 30 of the solder sphere 20 most often starts at the perimeter of the tacky dot 28 and was initially small relative to the area of the tacky dot. With time the contact area of the solder sphere 20 was seen to increase as it is wet more and more by the tacky dot 28.

Figure 7C:
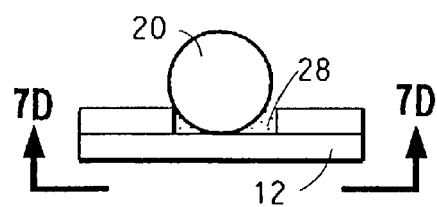
FIG. 7C is the section view of FIG. 7A after a predetermined dwell time when the condition is that the spherical particle contacts the substrate before contacting the complete circumference of the tacky dot.
Figure 7B:
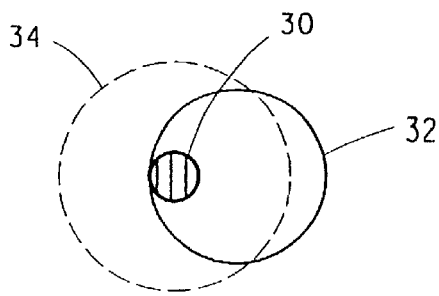
FIG. 7B is a plan view of FIG. 7A looking through a translucent substrate and tacky area.
Figure 7D:
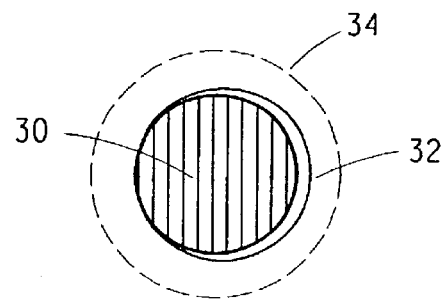
FIG. 7D is a plan view of FIG. 7C looking through a translucent substrate and tacky area.
Figure 7E:
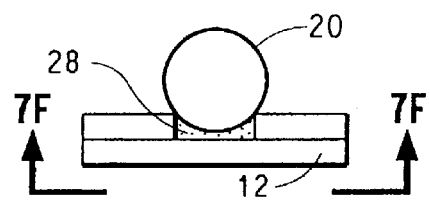
FIG. 7E is an alternative section view of FIG. 7A after a predetermined dwell time when the condition is that the spherical particle contacts the complete circumference of the tacky dot before the particle contacts the substrate.
Figure 7F:
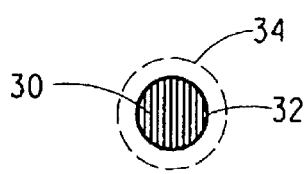
FIG. 7F is plan view of FIG. 7E looking through a translucent substrate and tacky area.

FIG. 7E illustrates the condition of FIG. 7A after a substantial hold time has taken place and wherein the relationship of the particle diameter, tacky dot diameter, and tacky dot thickness result in the particle contacting the entire perimeter 32 of the tacky dot surface before it bottoms out on the substrate 12. FIG. 7F illustrates view 7F—7F of FIG. 7E.

In case of FIGS. 7E and 7F the contact area 30 grew until its perimeter matched the perimeter 32 of the tacky dot 28 in which case the solder sphere 20 had rimmed out on the surrounding non-tacky surface and was completely centered over the tacky dot.

FIG. 7C illustrates the condition of FIG. 7A after a substantial hold time has taken place and wherein the relationship of the particle diameter, tacky dot diameter, and tacky dot thickness result in the particle bottoming out on the substrate 12 before the particle contacts the entire perimeter 32 of the tacky dot surface. FIG. 7D illustrates view 7D—7D of FIG. 7C.

In the case of FIGS. 7C and 7D the solder sphere 20 contact area increased until the sphere had sunk through the tacky dot 28 and rested against the substrate 12 of Kapton® film, in which case it had bottomed out and was partially and substantially centered on the tacky dot.

The contact area was observed until no further change was observed with time in which case equilibrium had been reached. Time to equilibrium is a measure of the embedding rate of the solder spheres in the tacky dots. Increasing the tacky dot temperature substantially decreases the time for embedding and centering of solder spheres in tacky dots. A 4 micron thickness is sufficient to center a 127 micron solder sphere in a 55 micron tacky dot as in FIGS. 7E and 7F whereas a 3 micron thickness results in a bottomed out situation as in FIGS. 7C and 7D before there is complete centering. Thus in the latter case there is only partial centering of the sphere with respect to the tacky dot (tacky area).

Calculations show that for a 4 micron thick adhesive area and a 127 micron (5 mil) sphere the tacky dot must be 44.4 microns in diameter or less for complete centering. For a 3 micron thick adhesive the tacky dot must be 38 microns or less for complete centering. Thus with the 55 micron tacky dot and 4 micron coating the 127 micron particle can be 5.3 microns off center. For the 3 micron adhesive the particle can be 8.5 microns off center.

Summarized below are some comparisons of observed wetting diameter at equilibrium versus calculated wetting diameter for several different sphere diameters and coating thicknesses.

| sphere diameter (micron) | coating thickness (micron) | calcd. wetting diameter (micron) | observed wetting diameter (micron) |
|---|---|---|---|
| 127 | 3.0 | 38 | 37.5–42.9 |
| 127 | 4.0 | 44.4 | 41.6–50.0 |
| 127 | 6.0 | 53.9 | |
| 127 | 10.0 | 68.4 | |
| 300 | 4.0 | 68.8 | |
| 300 | 8.0 | 96.7 | |
| 300 | 24.0 | 162.8 | |

NOTE:
calcd = calculated

The centering process continues until equilibrium is reached or the adhesive is inactivated or the particle is removed. Depending on the need for centering in the final use of the array of tacky areas populated with particles, it could be advantageous to speed up the centering and bring it nearer completion by the end of the population process. Heating the surface having an array of tacky and non-tacky areas with particles adhered thereon is the best method for both speeding up the centering process and building adhesion between the particles and the adhesive areas.

Significant increases in the adhesion of particles to the tacky areas occur with a hold time of 30 to 60 inutes and some improvement is evident in 1 to 2 inutes at 21° C. For hold times of one minute or less the overall efficiency of the population process shows significant improvement when the temperature is 30° C. or higher. Preferably, the population of the array of tacky and non-tacky areas is conducted at a temperature that is greater than or equal to 35° C. and less than the decomposition temperature of the tacky areas and less than the sticking temperature of the non-tacky areas. For photopolymers described in this invention the decomposition temperature of the tacky areas is greater than 100° C. and the sticking temperature of the non-tacky areas is dependent on the degree of photocuring and on the hold time. Although the non-tacky areas soften above 40° C. for a preferred composition for a light photocuring and above 60° C. for a strong photocuring, population can still be very efficient at 50° C. as long as the hold time is short (6 seconds). Preferably, the population of the array of tacky and non-tacky areas is conducted at a temperature that is equal to or greater than 35° C. and which is less than or equal to 80° C. More preferably, the population of the array of tacky and non-tacky areas is conducted at a temperature that is equal to or greater than 35° C. and which is less than or equal to 65° C. Most preferably, the population of the array of tacky and non-tacky areas is conducted at a temperature that is equal to or greater than 35° C. and which is less than or equal to 50° C.

The particles of this invention must be free flowing particles as defined supra, but, other than this requirement, can have any other properties as desired.

For many or most applications of this invention, it is desired to populate each tacky area of an array of tacky and non-tacky areas with one and only one particle. In order to populate each tacky area with one and only one particle, it is critical that the particle size be significantly larger than the size of the tacky area to be populated. In general, for cases involving population of tacky areas with various shapes, including irregular shapes, with particles of various shapes, including irregular shapes, a given tacky area should be no larger than about 30% of that of the particle. This value of 30% specifically applies for population of circular tacky areas with non-spherical particles. For spherical particles on circular tacky areas, it is suitable according to the invention to achieve a population of 1 particle for each tacky area when each tacky area is a circle having a diameter d1 and each of the particles is a sphere having a diameter d2, wherein d1/d2 is in the range from 0.1 to 1.0. Preferably, d1/d2 is in the range from 0.15 to 0.9. Most preferably, d1/d2 is in the range from 0.3 to 0.6.

Improved Methods

The invention in one embodiment is an improved method for transferring particles from an electrode plate to tacky areas present on a substrate. In this method, a substrate having both tacky and non-tacky areas (as described supra) is placed between first and second electrode plates, with the substrate and electrode plates being arranged substantially horizontally and stacked with one above or one below the other.

The particles being transferred in the method of this invention can be either electrically conductive particles or non-conductive particles. Conductive particles are preferred for transfer in this invention.

The meaning of substantially horizontally in this invention is that each of the indicated object(s) (e.g., substrate and electrode plates) has a main plane associated with it and that in the method of this invention the object is oriented such that its main plane is perpendicular to the gravitational field of Earth within 10 degrees, that is, perpendicular within 10 degrees to a plumb line at a given location on the Earth's surface.

The meaning of the terms "below" and "above" in this invention are used in the conventional sense and are used in reference to there being a stacking arrangement of the electrodes and the substrate. Specifically this term "below" is in reference of one object being placed or located closer to Earth's surface than is another object to which the first is being referenced. In this invention, the first electrode plate is located closest to Earth's surface. The substrate is located further from Earth's surface, such that it is above the first electrode plate. The second electrode plate is located further from Earth's surface than is the substrate, such that the second electrode plate is above the substrate.

In preferred embodiments, the first and second electrode plates in this invention have planar or substantially planar surfaces (for the active electrode area that is either at a potential or grounded). Similarly, the array of tacky areas in the substrate in preferred embodiments is planar or substantially planar. Shapes of the electrode plates and the array of tacky areas of the substrates otherwise are not limited—they can, for example, be rectangular, square, circular, or ellipsoidal.

In this invention, one of the electrode plates is spaced a distance from the tacky and non-tacky areas of the substrate and is spaced from the other electrode plate. There is no limit to the distance for the spacing between the tacky and non-tacky areas and the electrode except that it must be greater than the diameter of the largest particle(s). The spacing between electrodes is limited by the available voltage difference, or potential, between electrodes, and the particle weight.

The direct current potential that is applied in this invention between the first and second electrode plates is at least 500 Volts, preferably is at least 1000 Volts, and still more preferably is greater than 2000 Volts. The upper limit to the direct current potential is the value that causes arching between electrodes at their selected spacing. The direct current potential is applied for a time $T_1$ which can be for any time interval longer than 0.1 millisecond. In most instances, the time $T_1$ will be in the range from about 0.1 second to about 100 seconds, preferably in the range of 1 second to 100 seconds, more preferably in the range of 1 second to 10 seconds, and most preferably in the range of 2 seconds to 5 seconds.

In one embodiment of this invention where the particles are placed in contact with the first electrode, application of the direct current potential of sufficient magnitude will result in generation of an electric field, which causes the particles to become charged with the same charge (positive or negative) as the first electrode plate to which the particles are initially in contact. When the electric field is at least a certain minimal value, the particles move upwards against the force of gravity when the upward electrical force on the particles is higher in magnitude than the gravitational force. The electrical force tends to move the particles upward since the particles in contact with the first electrode plate have the same charge as the first electrode plate and are repelled by it. Also the particles are attracted by the second electrode plate when it has either the opposite charge or ground potential. The net result is that the particles can be made to move upwards against gravity by adjusting the direct current potential such that an electrical field is produced that acts on the particles with a higher upward force than is the force of gravity acting downward (towards Earth's surface). The particles are attracted towards the second plate electrode, but do not contact the second plate electrode since the particles first contact the substrate having an array of tacky and non-tacky areas that is placed between the two plate electrodes. When the particles contact the substrate having an array of tacky and non-tacky areas, some will contact tacky areas and some will contact non-tacky areas. Essentially all particles remain in contact with the substrate as long as the direct current potential is applied at the same level that caused the particles to move upwards. At least a portion of the particles will become adhered to the tacky areas of the substrate and these particles will remain adhered to the tacky areas even in the event the potential difference between the two electrodes is changed to zero, since the substrate in this invention is chosen to have an array of tacky areas having sufficient tack to cause particles that contact it to remain adhered even against the force of gravity tending to cause the particles to become unadhered (detached).

In some embodiments of the method of this invention, the method further comprises a step of changing the direct current potential to reverse the polarity on the first electrode plate while the particles are adhered to the tacky and non-tacky areas, which causes at least some of the particles to leave the non-tacky areas of the substrate, be propelled against the first electrode plate, again be charged and propelled from the first electrode plate to the substrate. The net result is that at least some of the particles that had been adhered to non-tacky areas prior to the polarity reversal become adhered to tacky areas at the end of the polarity reversal. When the polarity of the first electrode plate is reversed, the particles adhered to the substrate are now attracted to the first plate electrode. Predominantly those particles adhered to non-tacky areas will move away from the substrate to the first plate electrode. As soon as they contact the first plate electrode, the particles will become charged with the same charge (positive or negative) as the first plate electrode and consequently will now be repelled from the first plate electrode. The particles now will again move to the substrate since they are attracted at this point to the second plate electrode. Statistically, it is very unlikely that a given particle will contact the same exact spot on the substrate during the second contact that it did in the first contact with the substrate. There are various reasons for this, including air currents acting to displace the particles differently in successive contacts, particles bouncing against each other causing displacements from original trajectories in successive contacts, etc. Statistically, it is likely that the particles will contact different areas of the substrate in successive contacts with the substrate, which provides for enhanced probability of the particles contacting additional tacky areas and becoming adhered with each successive contact with the substrate.

Changing the direct current potential to reverse the polarity on the first electrode plate is done for a time $T_2$ which can be for any time interval longer than 0.1 millisecond. In most instances, the time $T_2$ will be in the range from about 0.1 second to about 100 seconds, preferably in the range of 1 second to 100 seconds, more preferably in the range of 1 second to 10 seconds, and most preferably in the range of 2 seconds to 5 seconds.

In some embodiments of this invention, the method further comprises repeating the polarity change for a number N of cycles of reversing the polarity of the first electrode plate, whereby at least some of the particles are repeatedly propelled against and become adhered to the substrate. As explained supra, each successive cycle increases the probability of a given particle for contacting a tacky area that is unpopulated and for populating this tacky area. The net result is that each successive cycle increases the net population efficiency in the overall population of the tacky areas of the substrate. There is no limit to the number N of cycles of reversing the polarity of the first electrode plate. In most cases, the number of cycles N is in the range from 2 to 1000, preferably in the range from 10 to 100, and more preferably in the range from 20 to 50. In some cases, N is 1, i.e., a single cycle, with only one polarity reversal of the first electrode plate or, in other cases, N is ½, i.e., a half cycle with a direct current potential being applied to the first electrode plate once with no polarity reversal(s).

In this invention, after applying a direct current potential to the first plate electrode and/or a number N of cycles of reversing the polarity of the first plate electrode has been carried out, it is highly desirable to have an efficient method for removing particles from non-tacky areas. One effective method for removing particles comprises applying ionized air to the substrate to at least partially neutralize electrostatic charges. The net result is that many or all particles disengage readily and separate from non-tacky areas once the electrostatic charges are reduced or eliminated.

Another effective method for removing particles from the non-tacky areas of the substrate after N cycles of polarity reversals (where N is ½, 1, or a number greater than 1) is a method which further comprises inserting a dielectric surface between the first electrode plate and the substrate, and spaced from the substrate, while the particles are on the substrate; and changing the direct current potential to reverse the polarity on the first electrode plate, causing the particles to leave the non-tacky areas of the substrate and be propelled against the dielectric surface. With the dielectric surface present, the particles are prevented from again contacting the first plate electrode and changing polarity. Once the potential difference between the two electrodes is brought to zero, the particles in contact with the dielectric surface readily roll off and/or can be removed from the dielectric surface.

Another way to remove particles from the non-tacky areas, which may be used separately or in addition to other methods just discussed, is to mechanically tap the substrate. The substrate with the populated tacky areas would be removed from between the electrodes and held so there is some tension in the substrate. An operator's finger, a bar, or a rod can be tapped against the back side of the substrate opposite the tacky and non-tacky areas to abruptly deflect the tensioned substrate and allow it to bounce back. Several such taps may be applied to facilitate removal of particles from the non-tacky areas.

Figure 9:
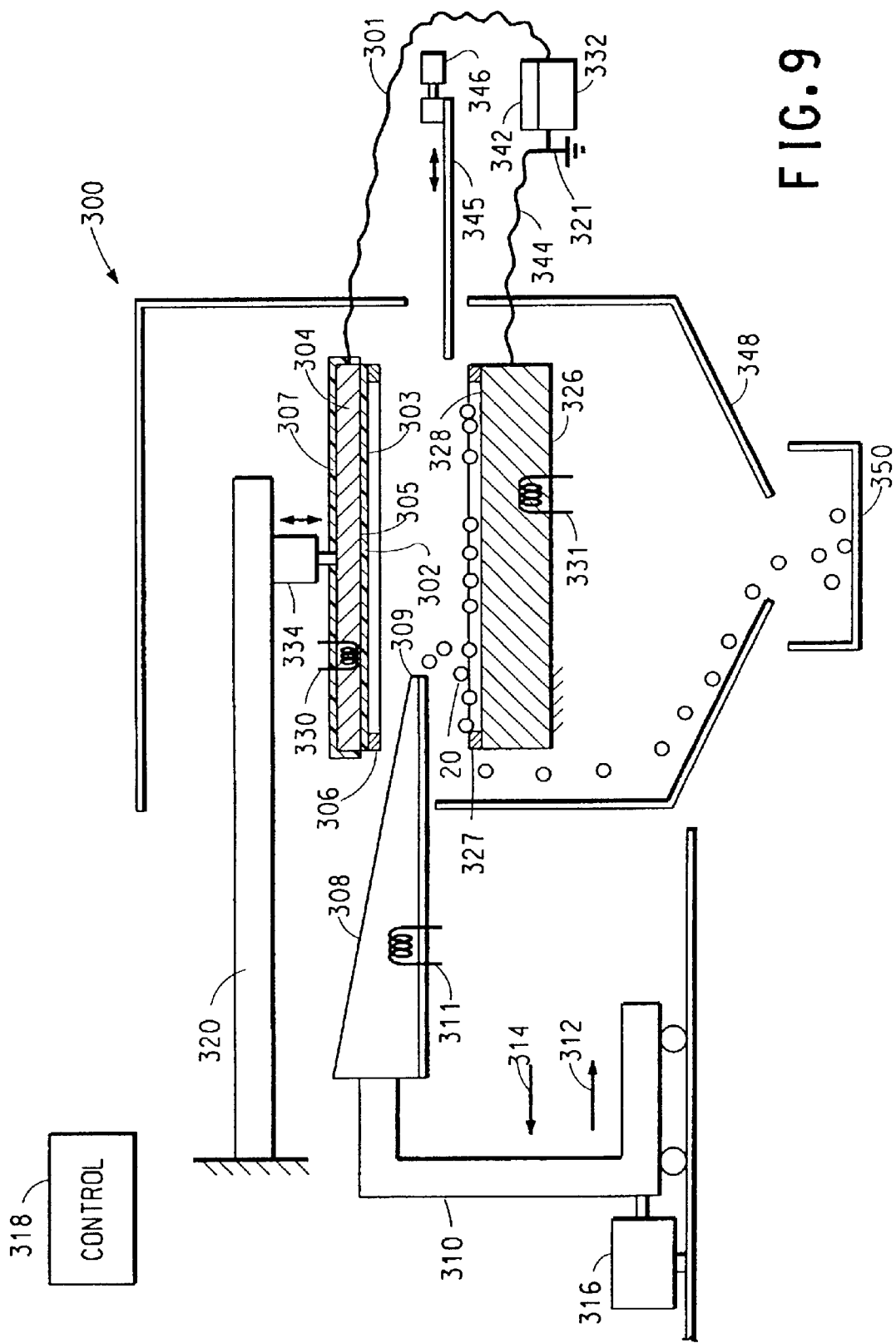
FIG. 9 is a schematic of an apparatus for mounting particles on a substrate having an array of tacky and non-tacky areas thereon, wherein the substrate is a discrete portion of web.

FIG. 9 shows a population device 300 that can be used to process a discrete web or substrate 302 having a surface 303 covered with arrays of tacky and non-tacky areas. A first electrode plate 326 is positioned below the web 302 and a second electrode plate 304 is positioned above the web 302. The web and plates are horizontal so particles can be placed on the electrode and held in place by gravity. The second electrode 304 may include a heater 330. The web is attached to a non-conductive, annular, support ring 306 which is attached to the lower surface 305 of second electrode 304 by taping or clamping so the web is contacting the surface 305 which is heated by heater 330 thereby heating the tacky areas. Alternatively, a separate web/substrate support can be provided (not shown) to position the web/substrate between the electrodes and spaced from the first electrode 326. Non-conducting material 307 is used to cover any exposed edges and the back side of electrode 304. Positioned beneath the web is first electrode 326 which is adapted to hold a plurality of particles on a top surface 328 by placement of a non-conductive, thin, annular ring 327 on surface 328 to keep the particles away from the edge of the substrate. Second electrode 304 is electrically connected to a DC power supply 332 by lead 301. The power supply 332 provides a source of DC potential and has a connection to ground 321 and includes a switch 342 for changing the polarity of the DC power connected to the lead 301. First electrode 326 is electrically connected to ground 321 by lead 344. The operation of the invention relies on establishing an electric field between the electrodes and does not require a closed electrical circuit to establish current flow. Either electrode could be connected to ground; the lower electrode was chosen for safety reasons since it is more accessible to accidental contact than the insulated upper electrode. The first electrode 326 may have a heater 331 that acts to heat the particles on surface 328. Above the web is a vibratory tray 308 attached to a moveable frame 310 that moves in the direction of arrows 312 and 314 being propelled manually or by an actuator 316. The actuator may be controlled by controller 318 as is the vibratory tray 308. The tray 308 extends across the width of the web 302 and has an outlet 309 on one side. The tray is filled with particles, such as particle 20, to be placed on the tacky areas on the web 302. The tray may also have a heater 311 for heating the particles as they rest on the tray bottom. The moving and vibrating tray acts as a particle dispenser to deliver particles 20 over the entire surface 328 of the first electrode 326. The second electrode 304 is connected to an actuator 334 which is mounted to a support 320 that is attached to a machine frame (not shown). The actuator 334 is controlled by controller 318 to move second electrode 304 toward and away from first electrode 326. The actuator 334 acts as a plate moving device that may be attached to the upper second electrode plate 304, as shown, or may alternatively be attached to the lower first electrode plate 326. It functions to space the first and second electrode plates away from each other to facilitate delivering particles over the first plate and for attaching and removing the web/substrate 302, and for spacing the plates toward each other to facilitate particle propulsion.

An enclosure 348 surrounds major portions of the population device as shown to contain any straying excess non-mounted particles for collection and reuse. A container 350 is at the bottom of the enclosure to capture the excess particles.

In operation, a sheet of the web 302 is mounted on the second electrode 304 with the image of tacky areas facing away from the electrode 304. If a cover sheet is used to protect the tacky areas of the web it would be removed at this time and the imaged web 302 would be treated with ionized air to neutralize the web. Particles such as solder spheres would be placed in the vibratory tray 308 in a quantity greatly in excess of what is required to populate the tacky areas. The heater 311 in the tray would be continually energized to heat the particles as they rest in the tray. Heating the particles by heaters 311 and 331 illustrate a way of providing the desired heat for the process to facilitate attachment and rapid centering of the particles on the tacky areas. Heating of the particles may be used as the sole heat source for the process, or in conjunction with substrate (web) heating by the heater 330 in electrode 304. Alternatively, the heated electrode 304 may be the sole source of heat in the process. Other heating means, such as radiation or convection means, may alternatively or additionally be used. What is important in all cases of heating is that the tacky areas are heated to a temperature of at least about 30° C. by whatever heating means is used. The vibratory tray would be briefly cycled to distribute the spheres uniformly across the tray at the outlet. Actuator 316 would be in a position to place the outlet 309 of the vibratory tray at the left end of surface 328 of first electrode 326 as shown. The controller 318 would signal the vibrator to turn on and begin dispensing particles that would fall from outlet 309 to the surface 328 of the first electrode 326. Controller 318 would signal actuator 316 to move frame 310 to advance the vibratory tray from left to right so the outlet 309 dispensing the spheres travels across the electrode. When the outlet 309 reaches the right end of the first electrode, the vibratory tray would be turned off and the actuator 316 would be reversed under the control of controller 318 to return the tray to the left of the assembly.

After the particles are dispensed and the tray is retracted, the controller 318 would signal the actuator 334 to lower second electrode 304 into close proximity to first electrode 326, until there is a predetermined gap between the upper electrode surface 305 and the surface 328 of the lower electrode. The gap affects the voltage level required to establish the desired electric field between the electrodes. The gap between the surface of the substrate attached to the top electrode and the bottom electrode must still be large enough at this electrode gap that some velocity is imparted to the particles to create a useful lateral scattering of particles to aid in populating efficiency. A larger gap to the substrate will result in a higher speed attained by the particles and more collisions between particles; this is believed to produce lateral particle motion that increases the probability of particles encountering tacky areas. A larger gap would require a higher electrode voltage, however.

The controller 318 would now control the switch 342 on DC power supply 332 to connect the negative pole (or positive pole) of the DC power supply to lead 301. After a predetermined time, the controller would control the switch to connect the positive pole to lead 301. After the predetermined time, the controller would cause the switch to reverse the polarity to the top electrode again. For solder sphere particles, a preferred predetermined time is 1–10 seconds and a more preferred time is 2–5 seconds. When the initial polarity is established between the top and bottom electrode, the particles are propelled toward the top electrode and attach to the substrate. For each subsequent polarity state change (half-cycle), the particles leave the substrate on the top electrode, contact the exposed surface of the bottom electrode and are discharged and recharged, and they are re-attracted to the substrate on the top electrode. After a predetermined number of polarity state changes (which may end with a half-cycle or full cycle), the controller 318 would control the switch 342 to disconnect the positive and negative poles of power supply 332 from the lead 301 to the second electrode 304, and connect lead 301 to ground 321. The particles 20 would ordinarily remain on the substrate 302 on the second electrode 304.

After the electrostatic cycling is complete, the web is held at rest for a predetermined time adjacent heated electrode 304. This heats the tacky areas so they will wet the surface of the particles 20 quickly which plays a role in increasing the attachment force and the area contact with the particle. If additional centering action is desired for a particular set of conditions, it may be desired to continue with additional holding time at an elevated temperature before removing the populated web.

The top electrode is raised by actuator 334 and the populated substrate 304 would be removed from the top electrode and a new unpopulated substrate could be mounted on the top electrode to repeat the populating process. The populated substrate that was removed would be treated with an ionized air stream to neutralize the remaining charge on the particles and substrate. The substrate would be gently tapped on the side opposite the particles to dislodge any particles remaining on the non-tacky areas to depopulate them. This would complete the populating/depopulating process for a discrete substrate.

An alternate method to facilitate depopulating the non-tacky areas of the substrate 302 is to provide a non-conductive sheet 345 and an actuator 346 to insert the sheet 345 between the electrodes in the gap between the surface 303 of web 302 and first electrode 326 before disconnecting the poles from lead 301. After inserting the sheet 345, the poles would be changed for the last time which would repel the particles from the non-tacky areas of the substrate and toward the first electrode 326. Since the particles would encounter the sheet 345 before reaching the conductive surface 328 of electrode 326, the charge on the particles would not get transferred by direct contact with the electrode and the particles would remain on the sheet 345. The lead 301 would be disconnected from the last pole and would be connected to ground. The upper electrode would be raised by actuator 334 and the substrate 302 populated primarily in the tacky areas would be removed. This technique for depopulating the non-tacky areas has been found to remove a significant percentage of particles from the non-tacky areas, but for complete removal, additional depopulating may still be required.

Another variation of the invention is possible if the tacky areas are distributed within a connected field of electrically conductive non-tacky areas that can be used as an electrode. In this case, the apparatus of FIG. 9 would remain essentially the same as discussed except lead 301 would be connected to the field of non-tacky areas (non-tacky electrode) and what was formerly electrode 304 would act simply as a support plate for the web 302. The operation would be changed substantially in that a pole of power supply 332 would only have to be connected by switch 342 to the non-tacky electrode once to start a continuous oscillation of particles between the first electrode 326 and the non-tacky electrode. As the charged particles contact the exposed electrode surfaces of either the first electrode 326 or the non-tacky electrode, each particle is discharged, oppositely charged, and repelled toward the opposite electrode. The repeated propulsion toward the substrate with tacky areas distributed throughout the field of connected non-tacky areas results in many opportunities for a particle to land on a tacky area and remain stuck there. After a predetermined time or number of oscillations, the lead 301 to the non-tacky areas is disconnected from the DC pole and connected to ground 321. The substrate is then processed as first discussed referring to FIG. 9. In this case just discussed, the tacky areas could also be electrically conductive and be electrically connected to the non-tacky areas, or not, and the process just discussed would operate the same.

Several variations in the device are possible and still practice the population process of the invention for a discrete web. Manual actuation and control can be practiced thereby eliminating controller 318. If heating of the particles is not required, heating means 311 (FIGS. 9 and 10) and 331 (FIG. 9) may be omitted; if heating of the tacky areas is not required, heater 330 (FIG. 9) and 331 (FIG. 10) may be omitted. Alternatively or in addition to heating with heaters 311, 331, and 330 is to heat the air in enclosure 348 so all elements of the device are at an elevated temperature that would tend to heat the tacky areas and particles. These modifications can still produce results that are an improvement over the prior art for populating particles on tacky areas.

Figure 10:
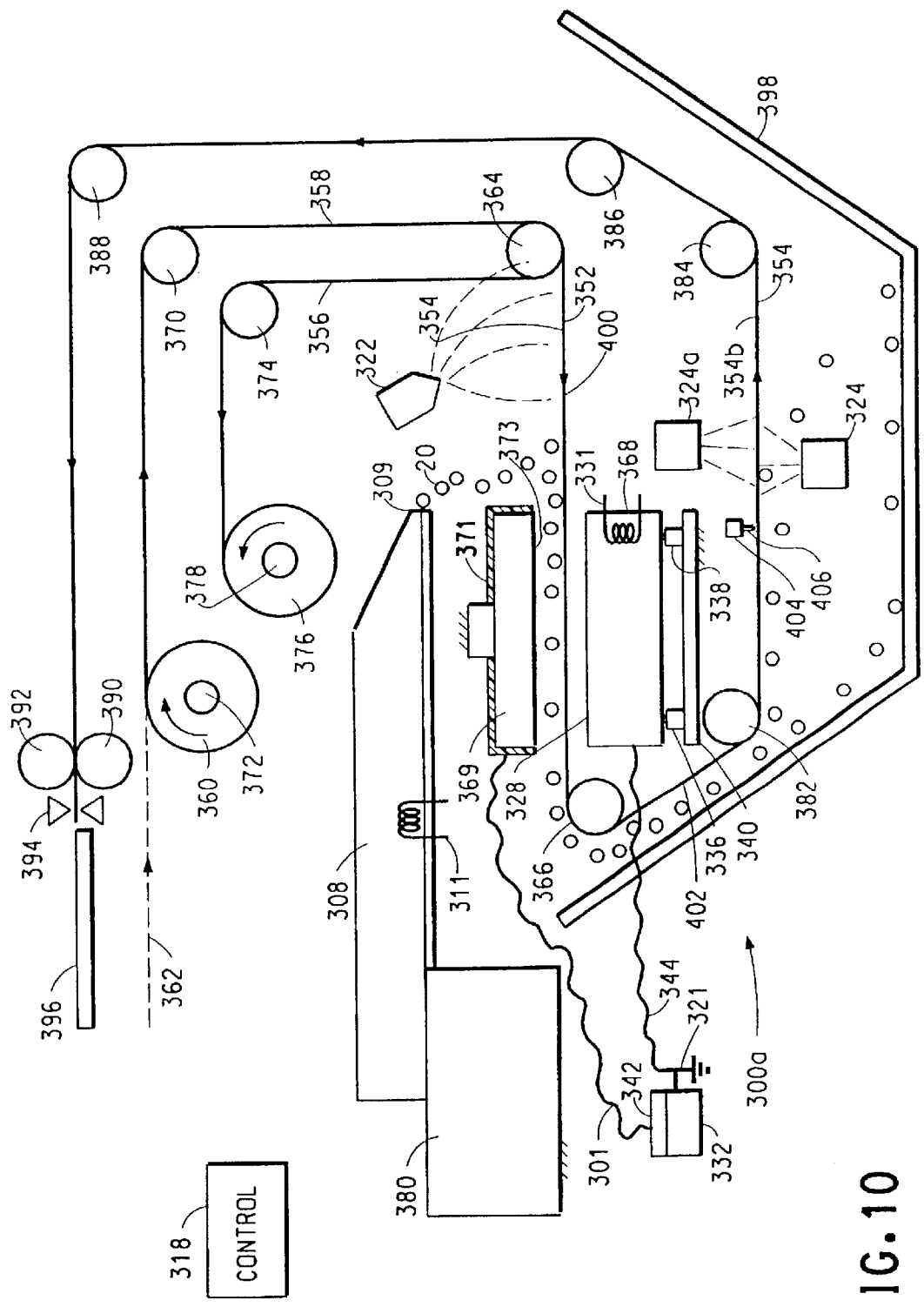
FIG. 10 is a schematic of an apparatus for mounting particles on a substrate having an array of tacky and non-tacky areas thereon, wherein the surface is a continuous elongated web.

FIG. 10 shows a population device 300a that can be used to process a continuous elongated web 352 having a surface 354 having repetitive arrays of tacky and non-tacky areas. In this case, the web 352 would be presented to the device combined with a continuous elongated cover 356 to form a protected composite web 358. The web 358 could be provided from a discrete roll 360 or could be provided from a previous web treatment process as indicated by dashed lines 362, such as an imaging process. The device 300a comprises a first web support roller 364 and a second web support roller 366 that support web 352 horizontally over a heated first electrode 368 positioned beneath the web. The horizontal orientation allows particles to be held in place on the web by gravity. The first electrode 368 can be raised and lowered (shown lowered) so upper surface 328 can be in or out of contact with the bottom-side 400 of the web 352. The plate has a heating means 331 that acts to heat the web 352 and the tacky areas thereon. The first electrode 368 is attached to actuators, such as actuators 336 and 338 that are attached to mounting plate 340 that is part of a machine frame. The actuators would be in communication with control 318 for coordination with other machine elements. In the up position, the actuators place the upper surface 328 of the heated first electrode in contact with the bottom-side 400 of the web. When the actuators are in the down position, the surface 328 of electrode 368 is spaced away from the bottom-side of web 352. Keeping the upper surface 328 out of contact with web surface 400 during web movement is believed to minimize static buildup. Non-contact also is believed to facilitate the neutralization of charges on the web by ionization devices to aid in depopulation of the non-tacky areas. The first electrode is electrically connected by lead 344 to ground 321.

Above the web is a second electrode 369 that is at least as big as the area covered by the tacky arrays on the web (substrate). Non-conductive material 371 is used to cover any exposed edges and the back side of second electrode 369. Lead 301 electrically connects the second electrode 369 to a switch 342 on a DC power supply 332. The second electrode surface 373 is spaced a predetermined distance from the surface 354 of web 352 which is under tension. When the first electrode is contacting web 352, it establishes a predetermined gap between surface 328 of electrode 368 and the surface 373 of electrode 369. The gap between electrodes affects the voltage level required to establish the desired electric field between the electrodes. The space between the surface 354 of the substrate and surface 373 of the second electrode 369 must still be large enough at the electrode gap that some velocity is imparted to the particles to create a useful lateral scattering of particles to aid in populating efficiency as discussed referring to FIG. 9.

The incoming composite web 358 is additionally guided by roller 370 and is tensioned by a braking device 372 acting on roll 360. The cover 356 is additionally guided by roller 374 and is collected in a discrete roll 376 tensioned by a winding device 378 acting on roll 376. Positioned above the web 352 is an ionization device 322 to neutralize static charges on the incoming web 352, especially that generated during stripping of cover sheet 356. Device 322 is directed at the position where cover 356 is peeled off web 352. Also above the web 352 is a vibratory tray 308 having an outlet 309 and heating means 311 as in FIG. 8 for dispensing particles 20. The vibratory tray is fixed to a machine frame at position 380. Web 352 is further guided by rollers 382, 384, 386, and 388 before passing between driven roller 390 and nip roller 392. The web 352 passes under nip roller 392 with the tacky area surface 354 facing roller 392 which is relieved in the central portion to avoid contact with any of the populated tacky areas. Cutting means 394 and holding table 396 are adjacent driven roller 390 and in the path of web 352.

Between rollers 382 and 384, the web is transported horizontally and passes between ionizing air knife 324 directed at the web surface 354, and ionizing air knife 324a directed at the opposite web surface 354b. The air knife is a known device that uses a row of ac corona discharge needles to ionize the surrounding air in a band. A sheet-like stream of flowing air is directed past the needles to forcefully distribute the ionized air over the web surface. The corona discharge function can also be used effectively if separated from the air function when air flow is not desired. The devices 324 and 324a extend across the width of the web 352. Tapping device 404 is positioned to be able to contact side 354b of web 352 opposite the tacky and non-tacky arrays. The tapping device has a moveable member 406 that extends out to contact the web when desired. The tapping acts to mechanically dislodge particles on the non-tacky areas of the web. A tapping impact frequency of 1–2 taps per second and a tapping amplitude of 0.03–0.3 inches web movement has been found to be effective for depopulating the non-tacky areas. Beneath the device 300*a* is a container 398 for collecting excess particles 20. Controller 318 is used to control the various elements of the device 300*a*.

In operation of the device 300*a*, an elongated composite web 358, having multiple repeating tacky and non-tacky arrays imaged thereon, would be provided from roll 360 and would be threaded over roller 370 and support roller 364 that acts as a first transport roller for transporting the web between the electrodes. Cover 356 would be peeled off of the composite web at roller 364 leaving web 352 to proceed to support roller 366 that acts as a second transport roller for transporting the web between the electrodes. Cover 356 would proceed over roller 374 to roll 376 where it will be wound, driven by winding device 378. Web 352 would be threaded around rollers 382, 384, 386, and 388 and through the nip formed by driven roller 390 and nip roller 392. Driven roller 390 may be propelled by a drive such as a servo motor, stepping motor, or the like under the control of controller 318 to achieve precise movement of web 352. Control of braking device 372 by controller 318 will provide tension control for web 352 and composite web 358. Control of winding device 378 by control 318 will provide tension control for web 356.

The web is stopped to position a complete tacky area array over heated first electrode 368 and under second electrode 369 and another adjacent array under ionization device 322. During advance of the web 352, the electrode 368 is retracted to avoid rubbing contact with web 352 which would generate electrostatic charges that would be difficult to neutralize. It is significant that the web 352 is at one point not contacting any surfaces between support rollers 364 and 366 to thereby provide good conditions for electrostatic charge neutralization. During advance of the web 352, vibratory tray 308 is energized to dispense particles 20 through outlet 309 to fall onto the static neutralized web 352. As the particles are cascading onto web 352, one repeat of the multiple tacky arrays on web 352 passes by the outlet 309 so one entire array is covered by this relative motion between web 352 and outlet 309. When the covered array stops over electrode 368, the vibratory tray is deenergized and the flow of particles from outlet 309 stops. It may be desirable to position the outlet 309 so that when the web 352 stops, the outlet is over a gap between multiple arrays. The rollers 390 and 392, cutting means 394, and holding table 396 are preferably positioned so that when the array stops over plate 368, a populated array also is positioned with the gap between arrays located at the cutting means 394. The cutting means can then be actuated by controller 318 to cut between the arrays and thereby separate one populated array from the continuous web 352 as desired for further handling.

When the covered array stops over electrode 368, actuators 336 and 338 are signaled by controller 318 to raise electrode 368 to contact the bottom-side 400 of web 352 and establish the predetermined electrode gap between electrodes 368 and 369. The heated surface 328 of electrode 368 quickly heats the tacky areas on the web. The controller 318 would now control the switch 342 on DC power supply 332 to connect the negative pole (or positive pole) of the DC power supply to lead 301. This results in particles being propelled off the web 352, contacting electrode surface 373, and being propelled back to web 352 to thereby populate previously unpopulated tacky areas thereon. After a predetermined time, the controller would control the switch to connect the positive pole to lead 301 which would again cause propulsion of particles to surface 373 and back to surface 352. After the predetermined time, the controller would cause the switch to reverse the polarity to the top electrode again as discussed referring to FIG. 9. After a predetermined number of polarity cycles, the lead 301 is disconnected from the power supply poles and is connected to ground 321. The web is held at rest in contact with heated surface 328 for a predetermined time during which the web is heated and the particles on the tacky arrays are firmly adhered and centered in each tacky area. After the predetermined hold time, the electrode 368 is retracted out of contact with web 352 and the controller causes driven roller 390 to advance the web a distance of one tacky array. As the just populated array passes over support roller 366, the particles on the non-tacky areas of the array progressively cascade down off the web and are collected in container 398. The progressive cascading and the angled web path at 402 prevent a large quantity of particles from coming off the web all at once that might dislodge the particles attached to the tacky areas. The flexibility of the web permits this progressive change in path over roller 366.

As the web with previously populated arrays is moving between rollers 382 and 384 the controller turns on air flow to air knives 324 and 324*a* positioned between the rollers. The ac corona to the air knives may remain on continuously. Air knife 324 acts to blow off excess particles that may still be temporarily adhered to the non-tacky areas as the moving web 352 passes by knife 324. During web movement, the controller 318 also directs tapping device 404 to tap the web for a predetermined time or number of taps. Air knife 324*a* similarly acts to blow off any particles that may have inadvertently fallen onto the back-side of the web 352. When the web motion stops for the next cycle, the air-flows to air knives 324 and 324*a* are turned off by controller 318. Tapping device 404 could alternatively be actuated for its predetermined duration only during the time the web motion is stopped.

After stopping the web motion, controller 318 also activates holding table 396 to grasp populated web 352 with a vacuum while cutting means 394 is cycled to cut the web between populated arrays. The entire cycle just described can now repeat for the next tacky array on the continuous elongated web. Such an automated device 300*a* for populating a continuous web offers productivity advantages and labor savings not possible before.

Referring to FIG. 10, there can be several variations to the hold time for the populated web in the process. A first hold time may occur beginning just after the particles have been agitated by the electrodes and the web is resting on heated electrode 368 and before the web is indexed off electrode 368 to present a new array for populating. During this time no forces are applied to the excess particles to try to remove them that may result in disturbing the particles on the tacky areas. A second hold time may occur beginning just after the web has been advanced to move the just populated array off the electrode 368 and over the roller 366. Many of the excess particles will fall off the web due to gravity as the web is bent over roller 366, but the excess particles will not yet have been aggressively removed by air jets or vibrations (tapping). During this hold time the particles on the tacky areas have not been disturbed and may still be undergoing additional wetting by the tacky material to improve adhesion and centering. This second hold time extends until the populated array is advanced past the air knife 324 during one of the web advances. A third holding time may occur beginning just after the excess particles have been aggressively removed by air knife 324 and before the array leaves the apparatus environment after rollers 390 and 392. The first, second, and third hold times are controlled times when the populated web may be treated with independently controlled heating means, or may not be heated, for predetermined times to improve adhesion and centering of the particles, if they have not yet reached the limits of centering, before the populated web is handled for further use.

Variations in the device 300a are possible and still practice the population process of the invention. For instance, different heating means may be employed to heat the tacky areas between support rollers 364 and 366. Hot air convection heating may be employed with the air directed at the surface 354 and/or back-side 400. Radiant heating may also be alternatively employed or employed in combination with other heating means and directed at the surface 354 and/or back-side 400 of web 352. When these alternate variations are employed, electrode 368 may not be heated and it may be spaced from the web.

The process just described referring to FIG. 10 where the substrate is placed over the first electrode and covered with particles can also be practiced with a discrete substrate instead of a continuous substrate. Referring to FIG. 9, the substrate 302 can be removed from electrode 304 and placed on surface 328 of first electrode 326 with the tacky and non-tacky areas facing electrode 304. The particles would be distributed over substrate 302 and the DC pole connected to electrode 304. The populating would take place as described for the similar setup referring to FIG. 10. Depopulation would take place as already described for FIG. 9 by removing the substrate from electrode 326 and going through the depopulating steps.

The population methods of this invention will afford populated surfaces having an array of tacky and non-tacky areas in which almost all of the tacky areas of the surface are populated with one particle per tacky area upon completion of execution of the method. Typically, there will be at least 99.99% of tacky areas of the surface populated with one particle per tacky area.

The population methods of this invention will afford populated surfaces having an array of tacky and non-tacky areas in which very few particles remain attached to non-tacky areas upon completion of execution of a given method. Typically, there will be fewer particles than one per 10,000 that remain in the non-tacky areas.

EXAMPLES

Example C-1

The photosenstive layer of the unimaged tacky dot film used in the examples that follow had the following composition:

| Ingredient | Amount (g) | % by Weight |
|---|---|---|
| Poly(methyl methacrylate), MW* = ~250,000 | 6.97 | 12.18 |
| Poly(methyl methacrylate), MW* = ~20–40,000 | 9.39 | 16.41 |
| Pentaerythritol triacrylate | 14.54 | 25.41 |
| Tetraethylene glycol dimethacrylate | 9.02 | 15.77 |
| Monoacrylate of resin from bisphenol A and epichlorohydrin, MW* = ~3,500 | 12.53 | 21.90 |
| 2,2'-Bis(o-chlorophenyl)-4,4',5,5'-tetraphenyl-1,2'-biimidazole | 4.18 | 7.31 |

-continued

| Ingredient | Amount (g) | % by Weight |
|---|---|---|
| 4,4'-Bis(diethylamino)benzophenone | 0.251 | 0.44 |
| Leuco Crystal Violet (Aldrich Chemical Co., Milwaukee, WI) | 0.275 | 0.48 |
| 1,4,4-Trimethyl-2,3-diazobicyclo-(3.2.3)-non-2-ene-dioxide | 0.0286 | 0.05 |
| 4-Methoxyphenol | 0.0286 | 0.05 |
| TOTAL | 57.2132 | |

*MW = weight average molecular weight

The photosensitive layer was coated onto Kapton® E (50 microns thickness, DuPont, Wilmington, Del.) and dried to give a dry coating thickness of the photosensitive layer of 3 to 25 microns.

The unimaged tacky dot film was imaged in the examples using contact exposure through a phototool by ultraviolet light at 365 nm and exposure level of 5 to 20 millijoules/cm2.

Example 1

This example illustrates a basic process and apparatus used for electrostatic populating. Two electrodes were used, each comprising a five inch square aluminum plate ⅛" thick. One plate was used as a bottom electrode and was left completely uncovered and was connected to a ground on a high voltage power supply. The other plate was used as a top electrode and was covered completely on one side and the edges and partially covered on the other side with Kapton® tape, which is a non-conductive covering. The partially covered side had a central opening about 4 inches square where the electrode was uncovered. The top electrode was arranged to be connected to either the positive or negative lead of a high voltage power supply which was as follows:

Hipotronics Model 8100B (Brewster, N.Y.)
0–100 kilovolts
0–5 milliamperes
DC, reversible, continuous duty, 2% rms ripple
115 VAC, 50/60 cycle input The particles to be populated on the substrate are 5 mil diameter solder spheres composed of 63% tin and 37% lead. They were obtained from Indium Corp. of Utica, N.Y.

Process:

A non-conductive substrate having a photopolymer adhesive having an array of tacky and non-tacky areas covering an area of about 4 inches by 4 inches was taped over the 4 inch by 4 inch exposed area of the top electrode plate so that none of the top electrode was exposed. The tacky areas were facing outward. The process was carried out at ambient conditions without any special air filtration or humidity or temperature controls.

A quantity of 5 mil diameter solder spheres (in excess of the number required to populate all tacky areas with at least one sphere) was approximately uniformly distributed over the surface of the bottom electrode plate in a one to two sphere thick layer. The top electrode plate was placed at a gap of 0.050 inches from the surface of the bottom electrode, which affects the voltage level to establish the field. The gap between the surface of the substrate attached to the top electrode and the bottom electrode must still be large enough at this electrode gap that some lateral velocity is imparted to the spheres to create a useful lateral scattering of spheres to aid in populating efficiency. The bottom plate was grounded and the top plate was contacted with the negative lead at a potential of 4 kilovolts DC which was held to the top plate for a period of time. The solder spheres were observed to leave the bottom electrode and be propelled toward the top electrode and impact the substrate having an array of tacky and non-tacky areas. Some of the spheres were propelled immediately and some were propelled later such that movement of the spheres between the bottom electrode and substrate on the top electrode made a sound that resembled falling rain. After about 2–5 seconds, the motion of the spheres was greatly reduced and the sound stopped.

The negative lead was removed from the top electrode and the positive lead at a potential of 4 kilovolts DC was brought into contact with the top electrode. The spheres were repelled away from the top electrode and after contacting the bottom electrode, they were propelled once again to the top electrode. The "raining" movement of the spheres was repeated as the positive lead was maintained in contact for 2–5 seconds. The positive lead was removed at this point from the top electrode. The above completes and defines one cycle of polarity reversals from zero to positive to negative and back to zero. This cycle of polarity reversals resulted in the spheres being propelled twice from the bottom toward the top electrode. At the end of the above cycle, the spheres were observed to reside on the substrate attached to the top electrode. The top electrode was now grounded to remove any residual voltage. This grounding had little effect on the spheres which are believed to have a static charge that resists the effects of gravity on the spheres.

After removal of the substrate it was noted that spheres were attached to both tacky and non-tacky areas. The substrate was mechanically tapped on the side opposite the spheres and most of the balls attached to non-tacky areas were dislodged. The tapping was accomplished by the operator flicking his finger against the substrate held along one edge and hanging downward. About 4–6 finger flicks were applied about 1 second apart to dislodge the balls from the non-tacky areas. The population efficiency was analyzed by dividing the number of correctly populated tacky area sites by the total number of sites. No attempt was made to account for failure to populate due to dust or other contamination of tacky dot sites, nor was any adjustment included for extra spheres in background non-tacky areas. The population efficiency was 92%, which was considered good for the uncontrolled conditions used.

Examples 2–4

To explore the effect of number of propulsion cycles upon the population efficiency, the following three tests were run (Examples 2–4).

Example 2

In Example 2, the lower limit of cycles possible was tested which is one-half a cycle. The setup of Example 1 was used. The negative lead was contacted to the top electrode for 2–5 seconds until the "raining" of spheres from the bottom toward the top electrode stopped. The negative lead was removed from the top electrode and the electrode was grounded. The substrate was removed and tapped, and the population efficiency was then measured as in Example 1. The population efficiency was found to be 69%, which was significantly less than that in Example 1. It is believed that only one propulsion of spheres toward the substrate does not afford enough opportunities for at least one sphere to contact each tacky dot in the array.

Example 3

The setup of Example 1 was used. The negative lead was contacted to the top electrode for 2–5 seconds until the "raining" of spheres from the bottom toward the top electrode had stopped. The negative lead was then removed and the positive lead connected for 2–5 seconds as in Example 1. This sequence was repeated five times so that 5 cycles of polarity reversals occurred that propelled the spheres from the bottom electrode toward the top electrode a total of 10 times (2 times/cycle and 5 cycles). At the end of the fifth cycle, the lead was removed from the top electrode and it was grounded as in Example 1. The substrate was removed and tapped and the population efficiency was measured as in Example 1. The population efficiency was 93%, which was slightly better than that in Example 1.

Example 4

The setup of Example 1 was used. The negative lead was contacted to the top electrode for 2–5 seconds until the "raining" of spheres from the bottom toward the top electrode had stopped. The negative lead was then removed and the positive lead connected for 2–5 seconds as in Example 1. This sequence was repeated ten times so that 10 cycles of polarity reversals occurred that propelled the spheres from the bottom electrode toward the top electrode a total of 20 times (2 times/cycle and 10 cycles). At the end of the tenth cycle, the lead was removed from the top electrode and it was grounded as in Example 1. The substrate was removed and tapped and the population efficiency was measured as in Example 1. The population efficiency was 95%, which was believed to be significantly better than that in Example 1.

Example 5

Tests were run to determine the applicability of using an electrostatic particle propulsion process for propelling electrically non-conductive particles, (unlike the spheres used in Examples 1–4, which were all electrically conductive). As this test was not identical to that in Examples 1–4, the spheres were included as a point of comparison. In this series of tests, the substrate was omitted as was the non-conductive covering on the surface of the top electrode facing the bottom electrode. The top electrode was 12 inches square and the bottom was 6 inches square. The electrodes were spaced apart at two distances depending on the particles and voltage used. Particles were initially placed on the bottom electrode which was grounded, and the top electrode was connected to either the negative or the positive lead of the power supply. Testing indicated the polarity of the lead did not affect the results. Upon connecting the selected lead to the top electrode, the particles were propelled to the top electrode. As soon as the particles contacted the exposed top electrode, they were repelled back to the bottom electrode from which they were propelled back again to the top electrode. This oscillation or bouncing of the particles between the top and bottom electrode continued until the particles bounced out from between the electrodes, became attached to one electrode, or until the lead was removed from the top electrode.

The following table summarizes the results that were obtained.

| Particle | Size Micron | Density g/cc | Gap mm | Voltage (KV) to Levitate and Initiate Bouncing |
|---|---|---|---|---|
| solder spheres | 127 | ~9 | 28.1 | 13.5 |
| solder spheres | 127 | ~9 | 15.8 | 7.0 |

-continued

| Particle | Size Micron | Density g/cc | Gap mm | Voltage (KV) to Levitate and Initiate Bouncing |
|---|---|---|---|---|
| polystyrene spheres | 113 | 1.06 | 15.8 | 4.0 |
| glass spheres | 125 | 2.48 | 15.8 | 4.0 |

The solder spheres and glass spheres oscillated about 2–20 seconds until most had bounced out from between the electrodes aided by air currents. The polystyrene spheres were observed to eventually stop bouncing between electrodes after about 10–40 seconds and to cling to the two electrodes. Somewhere between about 1/3 to 2/3 of the particles were distributed on each electrode. It is believed this occurred with the polystyrene due to high charging and the inability to quickly discharge the polystyrene. The example demonstrates the ability of electric fields to levitate both conductive and non-conductive particles.

Example 6

This example illustrates the effect of a conducting ground plane on the mobility and electrostatic charging of eutectic solder spheres rolling across a photocured polymeric coating with and without an electrically conducting aluminum ground plane between the coating and a polyester film support.

The coating was applied by lamination as a 4 micron thick layer of tacky photopolymer having the composition below:

| Ingredient | Amount (g) | % by Weight |
|---|---|---|
| Poly(methyl methacrylate), MW* = ~250,000 | 6.97 | 12.18 |
| Poly(methyl methacrylate), MW* = ~20–40,000 | 9.39 | 16.41 |
| Pentaerythritol triacrylate | 14.54 | 25.41 |
| Tetraethylene glycol dimethacrylate | 9.02 | 15.77 |
| Monoacrylate of resin from bisphenol A and epichlorohydrin, MW* = ~3,500 | 12.53 | 21.90 |
| 2,2'-Bis(o-chlorophenyl)-4,4',5,5'-tetraphenyl-biimidazole | 4.18 | 7.31 |
| 4,4'-Bis(diethylamino)benzophenone | 0.251 | 0.44 |
| Leuco Crystal Violet (Aldrich Chemical Co., Milwaukee, WI) | 0.275 | 0.48 |
| 1,4,4-Trimethyl-2,3-diazobicyclo-(3.2.3)-non-2-ene-dioxide | 0.0286 | 0.05 |
| 4-Methoxyphenol | 0.0286 | 0.05 |
| TOTAL | 57.2132 | |

*MW = weight average molecular weight

The photosensitive composition is suitable to give a dry coating thickness on a substrate of 3 to 25 microns.

The coating was applied as a 4 micron thick layer of tacky photopolymer onto 2 mil thick aluminized Mylar® for a first sample, and was applied by coating as a 4 micron thick layer of tacky photopolymer onto plain Mylar® film for a second sample. The coating was covered by a 0.5 mil polyester film coversheet. The unimaged tacky dot film was imaged using contact exposure through a phototool. The coating was photocured by ultraviolet irradiation of sufficient intensity and duration to make the coating non-tacky, for instance ultraviolet light at 365 nm and exposure level of 5 to 20 millijoules/cm2.

The coated samples were cut to fit the bottom and sides of a six inch long inclined plane sample holder. The samples were folded at each side to cover the side of the sample holder. The coversheet was removed from the photocured polymer coating and the surface discharged by ionized air. The sample then was placed in the inclined holder.

Solder spheres 5 mils in diameter consisting of 37% lead, 63% tin from Indium Corporation of America, Utica, N.Y. were conveyed by a vibratory feeder (Syntron Magnetic Feeder, Model F-TO, FMC Corporation, Material Handling Division, Homer City, Pa.), dropped onto the top of the inclined plane sample holder heated at 50° C., and rolled into a Faraday cup (Model 253/22B, FMC Corporation, Material Handling Division, Homer City, Pa.) to measure electrostatic charge on the spheres. Drop height d between the lip of the feeder and the top of the sample holder was varied from 2.5 to 14 centimeters. Sample holder incline angle (theta) was varied from 15 to 45 degrees. Critical observations were:

1) whether all the solder spheres rolled across the inclined plane into the Faraday cup and
2) the electrostatic charge generated on the spheres by rolling across the sample.

All experiments were at 50% relative humidity.

Figure 11:
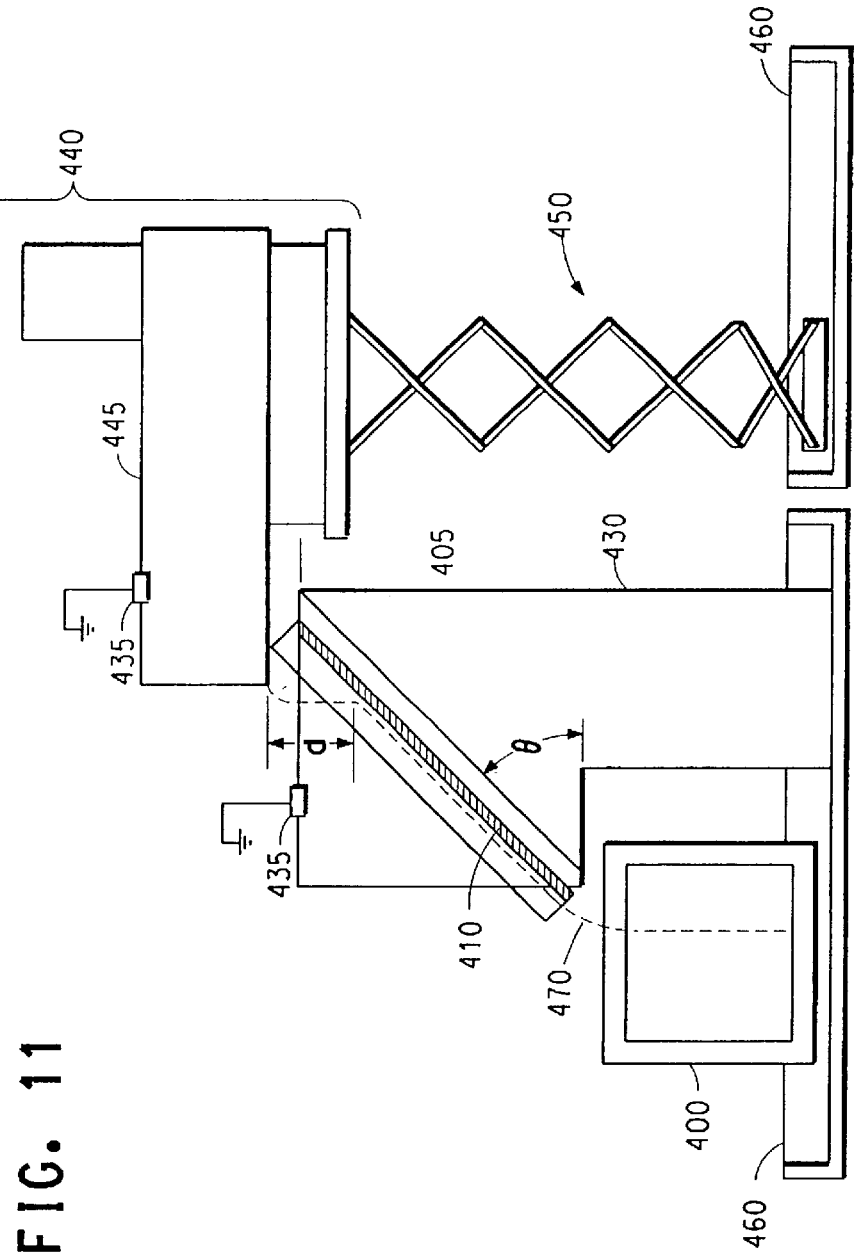
FIG. 11 is a schematic of the equipment used in Example 6 demonstrating the effect of a conductive substrate.

FIG. 11 illustrates the equipment used in this Example 6. A vibratory feeder 440 with electrically conductive tray 445 is mounted on a lab jack 450 such that the drop height d can be varied. An electrically conductive sample holder 430 was constructed such that the sample holder incline angle theta (Θ) could be varied. The sample 410 containing an array of tacky and non-tacky areas was placed on the sample holder 430 as shown in section view of the sample holder and sample. The vibratory feeder 440 and sample holder 430 were both grounded with grounding clips 435. Solder spheres exited the end 420 of the vibratory feeder 440, dropped a distance d to contact the sample 410, and then rolled down and off the sample 410 along a solder sphere path 470 to the Faraday Cup 400, where measurement of the electrostatic charge on the spheres was made. The complete apparatus was contained in two carbon fiber conductive trays 460.

It is clear from the experiments that samples without the conducting ground plane allowed some spheres to stick electrostatically and gave higher electrostatic charge to the spheres. None of the spheres stuck electrostatically while rolling down samples with the aluminum ground plane.

| Aluminum Ground | Drop (cm) | Angle (deg) | Sphere charge (nonocoulombs per gram) | Spheres elect-stat stuck |
|---|---|---|---|---|
| none | 14 | 30 | n2.6–4.2 | none |
| none | 14 | 45 | n3.1–4.4 | none |
| yes | 14 | 30 | n2.6–3.0 | none |
| yes | 14 | 45 | n2.0–2.6 | none |
| none | 10 | 30 | — | many stuck |
| none | 10 | 45 | n7.7–8.8 | none |
| none | 10 | 45 | n3.8–6.3* | some |
| yes | 10 | 30 | n3.3–4.0 | none |
| yes | 10 | 45 | n3.7–4.1 | none |
| none | 2.5 | 15 | — | most stuck |
| none | 2.5 | 30 | p1.8–n3.3* | some |
| none | 2.5 | 45 | n0.1–3.5* | some |
| yes | 2.5 | 15 | n0.1–0.3 | none |
| yes | 2.5 | 30 | n0.4–0.6 | none |
| yes | 2.5 | 45 | n1.6–2.1 | none |

*Sphere charge per gram inaccurate when some electrostatically stick. Actual charge per gram is larger.
n = negative charge; p = positive charge -continued

| Aluminum Ground | Drop (cm) | Angle (deg) | Sphere charge (nonocoulombs per gram) | Spheres elect-stat stuck |
|---|---|---|---|---|

— Indicates that in this case most spheres stuck to the film, and did not fall into the Faraday Cup. Consequently the reading was very low and very inaccurate. The information gained was that the static was so great that it caused the spheres to stick to the film, under the conditions as listed.

NOTE:
In some tests not recorded above in Example 6, a grounding clip was attached to the conductive aluminum coating on the sample, but it was not observed to change the performance significantly.

What is claimed is:

1. A method for mounting free-flowing particles in an array, comprising the steps of:
   (a) providing an article which comprises:
      (x) a substrate having thereon an array of tacky and non-tacky areas wherein each of the tacky areas has a size and bonding strength suitable for adhesion of one particle thereto; and
      (y) a conducting layer adjacent the tacky and non-tacky areas; and
   (b) flowing the particles across the surface having the array of tacky and non-tacky areas to allow particles to contact the tacky areas and adhere thereto and flow freely across the non-tacky areas.

2. The method of claim 1 wherein providing an article comprises providing the substrate (x) and the conducting layer (y) in one layer.

3. The method of claim 1, further comprising:
   (c) vibrating the substrate having the array of tacky and non-tacky areas with particles thereon causing the particles to reposition across the surface to allow particles to contact and adhere to all tacky areas;
   (d) holding the substrate having the array of tacky and non-tacky areas with particles adhered thereon and stopping the vibrating in step (c) to allow the particles to adhere and in addition move toward the centers of the tacky areas;
   (e) removing the excess particles not adhered to the tacky areas after completing step (d).

4. A method for mounting an array of particles to contact pads of an electronic device, comprising the steps of:
   (a) providing an article which comprises:
      (x) a substrate having thereon an array of tacky and non-tacky areas wherein each of the tacky areas has a size and bonding strength suitable for adhesion of one particle thereto; and
      (y) a conducting layer adjacent the tacky and non-tacky areas;
   (b) adhering an electrically-conductive particle to each tacky area;
   (c) placing the particles in contact with an electronic device having contact pads such that the particles on the array are placed in registry with the contact pads; and
   (d) disassociating the particles from the tacky areas and adhering the particles to the respective contact pads.

5. A method for mounting an array of particles to contact pads of an electronic device, comprising the steps of:
   (a) providing an article which comprises:
      (x) a surface having an array of tacky and non-tacky areas thereon aligned with contact pads of an electronic device such that the tacky areas are in registry with the contact pads, wherein each tacky area has a size and bonding strength suitable for adhesion of one particle thereto; and
      (y) a conducting layer adjacent the tacky and non-tacky areas;
   (b) adhering an electrically-conductive particle to each tacky area to form an array of particles; and
   (c) disassociating the particles from the tacky areas and adhering the particles to the contact pads.

6. The method of claim 4 or claim 5 wherein adhering an electrically conductive particle comprises adhering a particle that is selected from the group consisting of a metal, a metal oxide, an electrically-conductive polymer, solder and solder with flux.

* * * * *